United States Patent
Cilingir et al.

(10) Patent No.: US 10,354,886 B2
(45) Date of Patent: Jul. 16, 2019

(54) HYBRID EVOLUTIONARY ALGORITHM FOR TRIPLE-PATTERNING

(71) Applicant: Synopsys, Inc., Mountain View, CA (US)

(72) Inventors: Erdem Cilingir, Sunnyvale, CA (US); Srini Arikati, Mountain View, CA (US)

(73) Assignee: Synopsys, Inc., Mountain View, CA (US)

(*) Notice: Subject to any disclaimer, the term of this patent is extended or adjusted under 35 U.S.C. 154(b) by 184 days.

(21) Appl. No.: 14/185,717

(22) Filed: Feb. 20, 2014

(65) Prior Publication Data

US 2014/0245237 A1  Aug. 28, 2014

Related U.S. Application Data

(60) Provisional application No. 61/768,365, filed on Feb. 22, 2013.

(51) Int. Cl.
*G06F 17/50* (2006.01)
*H01L 21/308* (2006.01)
*G03F 7/20* (2006.01)

(52) U.S. Cl.
CPC ...... *H01L 21/3086* (2013.01); *G03F 7/70433* (2013.01); *G03F 7/70466* (2013.01)

(58) Field of Classification Search
CPC ...... G06F 17/5081; G06F 19/16; G06F 19/22; G06F 2217/12; G06F 17/30017; G06F 19/327; G06F 19/708; G06F 17/11; G06F 17/30699; G06F 17/5072; G06F 17/50; G06F 17/18; G06F 17/30507; G06F 2217/06; G06F 12/0875; G06F 12/1408; G06F 12/1458; G06F 15/78; G06F 21/52; G06F 21/6218; G06F 2212/1052; G06F 2212/402; G06F 2212/452; G06F 9/30072; G06F 9/30098; G06F 9/30101; G06F 9/3867; G06F 16/21; G06F 11/2094; G03F 1/36; G03F 7/70; G03F 7/70433;

(Continued)

(56) References Cited

U.S. PATENT DOCUMENTS

| 6,408,428 B1 | 6/2002 | Schlansker et al. |
| 6,421,809 B1 | 7/2002 | Wuytack et al. |
| 6,704,921 B2 | 3/2004 | Liu |

(Continued)

FOREIGN PATENT DOCUMENTS

| WO | WO 14/130783 A1 | 8/2014 |
| WO | WO 15/023856 A1 | 2/2015 |

OTHER PUBLICATIONS

International Search Report and Written Opinion for PCT Application No. PCT/US2014/017619 dated May 30, 2014, 10 pages.

(Continued)

*Primary Examiner* — Binh C Tat
(74) *Attorney, Agent, or Firm* — Alston & Bird LLP

(57) ABSTRACT

According to one embodiment of the present invention, a computer-implemented method for validating a design includes generating, using the computer, a first graph representative of the design, when the computer is invoked to validate the design, and decompose, using the computer, the first graph into at least three sets using a hybrid evolutionary algorithm to form a colored graph.

43 Claims, 14 Drawing Sheets

(58) Field of Classification Search
CPC .......... G03F 7/70466; G03F 1/70; G03F 1/68; G06K 9/6219; G06K 9/627
USPC ..................................................... 716/50–56
See application file for complete search history.

(56) References Cited

U.S. PATENT DOCUMENTS

| | | | |
|---|---|---|---|
| 6,829,216 B1 | 12/2004 | Nakata | |
| 7,049,589 B2 | 5/2006 | Yamaguchi et al. | |
| 7,114,141 B1 | 9/2006 | Teig et al. | |
| 7,560,201 B2 | 7/2009 | Liu | |
| 7,647,212 B2 | 1/2010 | Andreoli et al. | |
| 7,653,892 B1 | 1/2010 | Gennari et al. | |
| 8,069,423 B2 | 11/2011 | Ghan et al. | |
| 8,190,547 B2 | 5/2012 | Kirovski | |
| 8,209,656 B1 | 6/2012 | Wang et al. | |
| 8,312,394 B2 | 11/2012 | Ban et al. | |
| 8,316,329 B1 | 11/2012 | Rigby et al. | |
| 8,327,299 B1 | 12/2012 | Gennari | |
| 8,359,556 B1* | 1/2013 | Abou Ghaida | G06F 17/5081 716/50 |
| 8,402,396 B2* | 3/2013 | Kahng | G03F 1/70 716/110 |
| 8,434,043 B1 | 4/2013 | Hsu et al. | |
| 8,448,100 B1 | 5/2013 | Lin et al. | |
| 8,473,873 B2 | 6/2013 | Hsu et al. | |
| 8,484,607 B1 | 7/2013 | Tang et al. | |
| 8,515,724 B2 | 8/2013 | Joshi et al. | |
| 8,516,403 B2 | 8/2013 | Abou Ghaida et al. | |
| 8,601,409 B1 | 12/2013 | Chen et al. | |
| 8,661,371 B1 | 2/2014 | Wang | |
| 8,677,297 B2 | 3/2014 | Chase et al. | |
| 8,751,974 B2* | 6/2014 | Kahng | G03F 1/70 716/110 |
| 8,875,065 B1 | 10/2014 | Lin et al. | |
| 9,141,752 B2 | 9/2015 | Lin et al. | |
| 9,158,885 B1 | 10/2015 | Gray et al. | |
| 9,298,084 B2 | 3/2016 | Luo | |
| 9,360,750 B2 | 6/2016 | Lin et al. | |
| 9,384,319 B2 | 7/2016 | Cilingir et al. | |
| 9,740,814 B1 | 8/2017 | Ghosh | |
| 9,904,756 B1 | 2/2018 | Ruehl et al. | |
| 2009/0070550 A1 | 3/2009 | Solomon | |
| 2010/0050146 A1 | 2/2010 | Frankle et al. | |
| 2010/0064269 A1 | 3/2010 | Lai et al. | |
| 2011/0014786 A1 | 1/2011 | Sezginer et al. | |
| 2011/0052088 A1 | 3/2011 | Yuan et al. | |
| 2011/0078638 A1 | 3/2011 | Kahng et al. | |
| 2011/0197168 A1 | 8/2011 | Chen et al. | |
| 2011/0284996 A1 | 11/2011 | Kurusu et al. | |
| 2013/0007674 A1 | 1/2013 | Abou Ghaida et al. | |
| 2013/0024822 A1 | 1/2013 | Hsieh et al. | |
| 2013/0036397 A1 | 2/2013 | Lee et al. | |
| 2013/0061183 A1 | 3/2013 | Abou Ghaida et al. | |
| 2013/0061185 A1 | 3/2013 | Abou Ghaida et al. | |
| 2013/0074018 A1 | 3/2013 | Hsu et al. | |
| 2013/0174106 A1 | 7/2013 | Hsu et al. | |
| 2014/0007026 A1 | 1/2014 | Chen et al. | |
| 2014/0053118 A1 | 2/2014 | Chen et al. | |
| 2014/0189611 A1 | 7/2014 | Lai et al. | |
| 2014/0244215 A1 | 8/2014 | Nakayama et al. | |
| 2014/0282293 A1 | 9/2014 | Lin et al. | |
| 2014/0372958 A1 | 12/2014 | Lin et al. | |
| 2015/0040077 A1 | 2/2015 | Ho et al. | |
| 2015/0234974 A1 | 8/2015 | Dechene et al. | |
| 2015/0286771 A1 | 10/2015 | Choi et al. | |
| 2017/0004251 A1 | 1/2017 | Cilingir et al. | |
| 2017/0124242 A1 | 5/2017 | Sharma et al. | |
| 2017/0147740 A1 | 5/2017 | Chang | |
| 2017/0206300 A1 | 7/2017 | Xue et al. | |
| 2017/0336707 A1 | 11/2017 | Choi et al. | |

OTHER PUBLICATIONS

Beigel et al., "3-Coloring in Time O(1.3289ⁿ)," Journal of Algorithms 54: 168-204 (2005).

Dorigo et al., "An Introduction to Ant Colony Optimization," Universite Libre de Bruxelles Institut de Recherches Interdisciplinaires et de Developpements en Intelligence Artificielle (IRIDIA) Technical Report No. TR/IRIDIA/2006-010, 22 pages (2006).

Grosan et al., "Hybrid Evolutionary Algorithms: Methodologies, Architectures, and Reviews," Studies in Computational Intelligence (SCI) 75: 1-17 (2007).

Li et al., "14nm M1 Triple Patterning," Proceedings of the International Society for Optics and Photonics (SPIE) 8326: 832612-1—832612-7 (2012).

Tian et al., "A Polynomial Time Triple Patterning Algorithm for Cell Based Row-Structure Layout," 2011 Institute of Electrical and Electronics Engineers/Association for Computing Machinery International Conference on Computer-Aided Design (ICCAD), San Jose, California, pp. 57-64 (2012).

Yu et al., "Layout Decomposition for Triple Patterning Lithography," 2011 Institute of Electrical and Electronics Engineers/Association for Computing Machinery International Conference on Computer-Aided Design (ICCAD), San Jose, California, pp. 1-8 (2011).

Office Action as issued in corresponding Taiwanese Application No. 103105938, dated Oct. 5, 2015 (English translation thereof).

Fang et al., "A novel layout decomposition algorithm for triple patterning lithography,"in IEEE Trans. on Computer-Aided Design of Integrated Circuit s and Systems (TCAD), 33(3),:397-408, (2014).

Galinier et al.; "Hybrid Evolutionary Algorithms for Graph Coloring" Journal of Combinatorial Optimization, Kluwer Academic Publishers, pp. 1-33, (1999).

Knuth, "Dancing Links," arxiv.org, Cornell University Library, arXiv:cs/0011047 [cs.DS], 26 pages, (2000).

Kuang et al., "An Efficient Layout Decomposition Approach for Triple Patterning Lithography,"In: Design Automation Conference (DAC) 2013, pp. 1-6, (2013).

EPO Application No. 14753896.1, Reply to the Opinion with the European Search Report dated Jun. 21, 2017.

EPO Application No. 16200435.2 (Published as EP3193271), European Search Report and European Search Opinion dated Jun. 21, 2017.

U.S. Appl. No. 14/459,657, Non-Final Office Action dated Oct. 7, 2015.

U.S. Appl. No. 14/459,657, Notice of Allowance dated Mar. 11, 2016.

U.S. Appl. No. 14/678,831, Final Office Action dated Dec. 23, 2016.

U.S. Appl. No. 14/678,831, Non-Final Office Action dated Apr. 27, 2016.

U.S. Appl. No. 14/929,113, Non-Final Office Action dated Jun. 2, 2017.

U.S. Appl. No. 15/179,890, Non-Final Office Action dated Mar. 13, 2017.

WIPO Application No. PCT/US2014/051086, PCT International Preliminary Report on Patentability dated Feb. 15, 2016.

WIPO Application No. PCT/US2014/051086, PCT International Search Report dated Nov. 25, 2014.

WIPO Application No. PCT/US2014/051086, PCT Written Opinion of the International Searching Authority dated Nov. 25, 2014.

U.S. Appl. No. 14/678,831, Notice of Allowance dated Jul. 12, 2017.

U.S. Appl. No. 14/996,796, Non-Final Office Action dated Aug. 22, 2017.

U.S. Appl. No. 15/179,890, Non-Final Office Action dated Oct. 4, 2017.

U.S. Appl. No. 15/669,502, Non-Final Office Action dated Dec. 26, 2017.

U.S. Appl. No. 14/929,113, Final Office Action dated Feb. 14, 2018.

U.S. Appl. No. 14/929,113, Non-Final Office Action dated Aug. 9, 2018.

U.S. Appl. No. 14/996,796, Final Office Action dated May 3, 2018.

U.S. Appl. No. 15/179,890, Notice of Allowance dated May 10, 2018.

(56) References Cited

OTHER PUBLICATIONS

U.S. Appl. No. 15/179,890, Notice of Allowance dated Sep. 12, 2018.
U.S. Appl. No. 15/359,579, Non-Final Office Action dated Apr. 16, 2018.
U.S. Appl. No. 15/669,502, Notice of Allowance dated Aug. 16, 2018.
Fister, et al., "Using Differential Evolution for the Graph Coloring," 2011 IEEE Symposium on Differential Evolution (SDE), IEEE, pp. 1-7, (Apr. 11, 2011).
PCT International Preliminary Report on Patentability for application PCT/US2014/017619 dated Aug. 25, 2015.
Office Action as issued in corresponding Taiwanese Application No. 103105938, dated Jun. 5, 2015 (English translation thereof).
EP Supplementary European Search Report for application EP14753896.1 dated Dec. 20, 2016.
U.S. Appl. No. 15/669,502, Notice of Allowance dated Jan. 15, 2019.
U.S. Appl. No. 14/996,796, Non-Final Office Action dated Nov. 16, 2018.
U.S. Appl. No. 15/179,890, Non-Final Office Action dated Jan. 4, 2019.
U.S. Appl. No. 15/359,579, Final Office Action dated Nov. 26, 2018.
U.S. Appl. No. 14/929,113, Notice of Allowance dated Mar. 18, 2019.
U.S. Appl. No. 15/359,579, Notice of Allowance dated Apr. 16, 2019.

\* cited by examiner

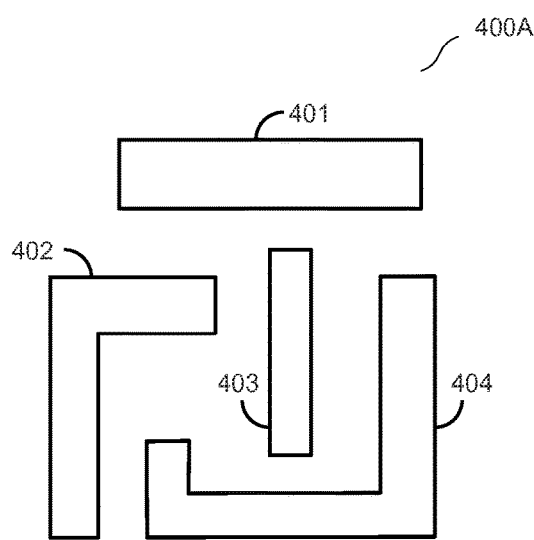 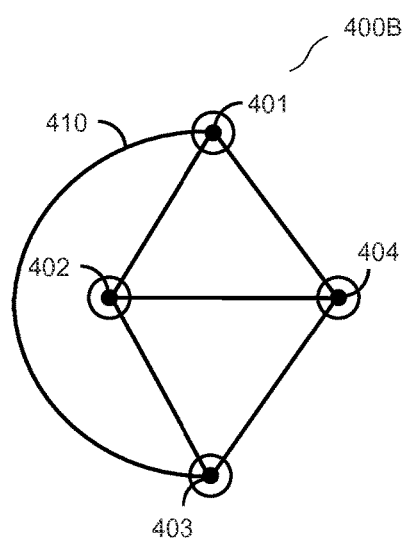
FIG. 4A                    FIG. 4B

HYBRID EVOLUTIONARY ALGORITHM FOR TRIPLE-PATTERNING

CROSS-REFERENCES TO RELATED APPLICATIONS

This application claims priority, under 35 U.S.C. § 119(e), from U.S. Provisional Application No. 61/768,365, filed on Feb. 22, 2013, entitled "HYBRID EVOLUTIONARY ALGORITHM FOR TRIPLE-PATTERNING", the contents of all of which is incorporated herein by reference in its entirety. This application is related to U.S. Pat. No. 8,312,394, entitled "METHOD AND APPARATUS FOR DETERMINING MASK LAYOUTS FOR A SPACER-IS-DIELECTRIC SELF-ALIGNED DOUBLE-PATTERNING PROCESS" by Yonchan BAN, et al., and U.S. Pat. No. 7,560,201, entitled "PATTERNING A SINGLE INTEGRATED CIRCUIT LAYER USING MULTIPLE MASKS AND MULTIPLE MASKING LAYERS" by Tsu-Jae King LIU, the contents of all of which are incorporated herein by reference in their entirety.

BACKGROUND

The present invention relates to electronic design automation (EDA), and more particularly, to a method and system for validating mask layouts using a triple-patterning technology.

Improvements in semiconductor integration densities have largely been achieved through corresponding improvements in semiconductor manufacturing technologies. As semiconductor manufacturing technologies move into the deep submicron era, the semiconductor industry is considering a number of new technologies, such as extreme ultraviolet (EUV) lithography and massively parallel electron beam lithography. Unfortunately, these technologies are not ready for production as yet.

Improvements in process technology can increase integration densities beyond what is achievable in present generation photolithography printing. As an example, double-patterning technology has been used for manufacturing design intents having higher pattern density than those pattern densities limited by what is directly printable by photolithography using a given generation manufacturing process. Double-patterning technology uses two different masks to produce higher pattern density in a design intent than is achievable by using just one mask. However, double-patterning technology is not able to handle design intents with more complex and higher pattern density that need to be printed using triple or higher multiple-patterning technology because of difficulty with design intent validation.

Accordingly, there is a need to validate design intents using triple or higher multiple-patterning technology.

SUMMARY

According to one embodiment of the present invention, a computer-implemented method for validating a design includes generating, using the computer, a first graph representative of the design, when the computer is invoked to validate the design, and decomposing, using the computer, the first graph into at least three sets using a hybrid evolutionary algorithm to form a colored graph.

According to one embodiment, the colored graph includes at least three colors. According to one embodiment, the design includes an integrated circuit.

According to one embodiment, the first graph includes a multitude of vertices. The method further includes, generating, using the computer, a multitude of sub-graphs from the first graph, decomposing, using the computer, each of a first subset of the multitude of sub-graphs into at least three sets using the hybrid evolutionary algorithm, and merging, using the computer, the at least three sets to generate one of at least three colors for each one of the multitude of vertices.

According to one embodiment, generating a multitude of sub-graphs from the first graph is performed using a graph simplification algorithm. According to one embodiment, the graph simplification algorithm is selected from a group consisting of connected component decomposition, bi-connected component decomposition, and hiding of vertices with degrees less than at least three.

According to one embodiment, the design includes a multitude of shapes. Each one of the multitude of vertices is associated with a different one of the multitude of shapes.

According to one embodiment, the design includes a multitude of shapes. The first graph includes a multitude of vertices and a multitude of edges. According to one embodiment, each one of the multitude of edges is associated with a different pair of the multitude of shapes, the pair of the multitude of shapes being associated with a design rule violation.

According to one embodiment, a conflict is detected when one of the multitude of edges is between a pair of the multitude of vertices colored with the same color. According to one embodiment, the design includes a multitude of shapes, the method further includes assigning, using the computer, each one of the multitude of shapes to a different one of at least three masks when a conflict is not detected after the decomposition. Each one of the at least three masks is associated with a different one of the at least three sets.

According to one embodiment, the method further includes generating, using the computer, a second graph representative of the design after detecting a conflict, the second graph being different from the first graph, and decomposing, using the computer, the second graph into at least three sets using the hybrid evolutionary algorithm to form a second colored graph including at least three colors. According to one embodiment, the second graph includes a multitude of vertices, the method further includes generating, using the computer, a second multitude of sub-graphs from the second graph, decomposing, using the computer, each of a second subset of the second multitude of sub-graphs into at least three sets using the hybrid evolutionary algorithm, and merging, using the computer, the at least three sets to generate one of at least three colors for each one of the multitude of vertices of the second graph, said colored second graph being representative of the design.

According to one embodiment, the method further includes resolving the conflict by reworking the design to form a reworked design after detecting at least one conflict and a stop condition, generating, using the computer, a second graph representative of the reworked design, the second graph being different from the first graph, and decomposing, using the computer, the second graph into at least three sets using the hybrid evolutionary algorithm to form a second colored graph including at least three colors. According to one embodiment, the stop condition is selected from a group consisting of a validation runtime, and a value corresponding to the number of the at least one conflict output by decomposing the first graph.

According to one embodiment, the design includes a multitude of shapes and reworking the design includes moving at least one of the multitude of shapes. According to one embodiment, the design includes a multitude of shapes and reworking the design includes changing at least one of the multitude of shapes.

According to one embodiment, decomposing includes creating, using the computer, a first coloring for the first subset by assigning one of at least three colors for each one of the multitude of vertices of the first subset using a randomized graph coloring heuristic. Decomposing further includes modifying, using the computer, the first coloring using a randomized first local search algorithm so as to decrease a value associated with the number of at least one conflict, when a conflict exists, to make a second coloring solution. Decomposing further includes returning, using the computer, the second coloring solution as the decomposed first subset of the multitude of sub-graphs when a condition defined by a first cost function is met.

According to one embodiment, the first cost function includes at least one of a number of conflicting edges, a number of conflicting vertices, or a distribution of colors. According to one embodiment, the randomized graph coloring heuristic includes at least one of a Recursive Largest First algorithm, a degree of saturation (DSATUR) algorithm, a sequential vertex coloring algorithm, or a coloring algorithm with polynomial time complexity. According to one embodiment, the randomized first local search algorithm includes at least one of a Tabu Search algorithm, or a Simulated Annealing algorithm.

According to one embodiment, the randomized graph coloring heuristic uses more than three colors to color each of the multitude of vertices for the first subset. According to one embodiment, the method further includes randomly assigning a color from a first three colors to a vertices having a color greater than three.

According to one embodiment, the decomposing further includes creating, using the computer, a first multitude of candidate coloring solutions. Decomposing further includes iteratively applying, using the computer, the hybrid evolutionary algorithm on the first multitude of candidate coloring solutions in accordance with the cost function to create a second multitude of candidate coloring solutions until a stopping criteria is met. Decomposing further includes selecting, using the computer, a coloring solution from the second multitude of candidate coloring solutions in accordance with a second cost function. Decomposing further includes returning, using the computer, the selected coloring solution as the decomposed first subset of the multitude of sub-graphs. According to one embodiment, the stopping criteria includes at least one of a count of iterations exceeds a predetermined count or until no coloring conflict is detected.

According to one embodiment, the hybrid evolutionary algorithm includes, selecting, using the computer, a multitude of parents from the first multitude of candidate coloring solutions. Decomposing further includes creating, using the computer, at least one offspring from the multitude of parents by merging a multitude of color classes from the multitude of parents. Decomposing further includes completing, using the computer, the coloring of at least one offspring. Decomposing further includes applying, using the computer, a second local search to the at least one offspring in accordance with the second cost function. Decomposing further includes replacing, using the computer, at least one candidate coloring solution from the first multitude of candidate coloring solutions by the at least one offspring using a third cost function.

According to one embodiment, the multitude of parents are selected randomly. According to one embodiment, the multitude of parents are selected in accordance with the second cost function.

According to one embodiment, each one of the multitude of color classes includes a set of the multitude of vertices assigned to the same color. According to one embodiment, the merging includes using a subset of a selected color class. According to one embodiment, the completing includes putting one of the multitude of vertices without an assigned color into one of the multitude of color classes at random.

According to one embodiment, the third cost function includes at least one of replacing the at least one candidate coloring solution having lowest quality, randomly replacing the at least one candidate coloring solution, or replacing the at least one candidate coloring solution having highest similarity to the at least one offspring.

According to one embodiment of the present invention, a non-transitory computer-readable storage medium including instructions which when executed by a computer cause the computer to generate a first graph representative of the design, when the computer is invoked to validate the design, and decompose the first graph into at least three sets using a hybrid evolutionary algorithm to form a colored graph.

According to one embodiment, the first graph includes a multitude of vertices. The instructions further cause the computer to generate a multitude of sub-graphs from the first graph, decompose each of a first subset of the multitude of sub-graphs into at least three sets using the hybrid evolutionary algorithm, and merge the at least three sets to generate one of at least three colors for each one of the multitude of vertices.

According to one embodiment, the design includes a multitude of shapes. The instructions further causing the computer to assign each one of the multitude of shapes to a different one of at least three masks when a conflict is not detected after the decomposition. Each one of the at least three masks is associated with a different one of the at least three sets.

According to one embodiment, the non-transitory computer-readable storage medium further causes the computer to generate a second graph representative of the design after detecting a conflict. The second graph is different from the first graph. The non-transitory computer-readable storage medium further causes the computer to decompose the second graph into at least three sets using the hybrid evolutionary algorithm to form a second colored graph including at least three colors.

According to one embodiment, the second graph includes a multitude of vertices. The instructions further cause the computer to generate a second multitude of sub-graphs from the second graph, decompose each of a second subset of the second multitude of sub-graphs into at least three sets using the hybrid evolutionary algorithm, and merge the at least three sets to generate one of at least three colors for each one of the multitude of vertices of the second graph. The colored second graph is representative of the design.

According to one embodiment, the non-transitory computer-readable storage medium further causes the computer to resolve the conflict by reworking the design to form a reworked design after detecting at least one conflict and a stop condition, and generate a second graph representative of the reworked design. The second graph is different from the first graph. The non-transitory computer-readable storage medium further causes the computer to decompose the second graph into at least three sets using the hybrid evolutionary algorithm to form a second colored graph including at least three colors.

According to one embodiment, the instructions to decompose further cause the computer to create a first coloring for the first subset by assigning one of at least three colors for each one of the multitude of vertices of the first subset using a randomized graph coloring heuristic. The instructions to decompose further cause the computer to modify the first coloring using a randomized first local search algorithm so as to decrease a value associated with the number of at least one conflict, when a conflict exists, to make a second coloring solution. The instructions to decompose further cause the computer to return the second coloring solution as the decomposed first subset of the multitude of sub-graphs when a condition defined by a first cost function is met.

According to one embodiment, the instructions to decompose further cause the computer to create a first multitude of candidate coloring solutions, iteratively apply the hybrid evolutionary algorithm on the first multitude of candidate coloring solutions in accordance with the cost function to create a second multitude of candidate coloring solutions until a stopping criteria is met. The instructions to decompose further cause the computer to select a coloring solution from the second multitude of candidate coloring solutions in accordance with a second cost function, and return the selected coloring solution as the decomposed first subset of the multitude of sub-graphs.

According to one embodiment, the instructions to apply the hybrid evolutionary algorithm further cause the computer to select a multitude of parents from the first multitude of candidate coloring solutions and create at least one offspring from the multitude of parents by merging a multitude of color classes from the multitude of parents. The instructions to decompose further cause the computer to complete the coloring of at least one offspring, apply a second local search to the at least one offspring in accordance with the second cost function, and replace at least one candidate coloring solution from the first multitude of candidate coloring solutions by the at least one offspring using a third cost function.

According to one embodiment of the present invention, a system for validating a design is configured to generate a first graph representative of the design, when the system is invoked to validate the design, and decompose the first graph into at least three sets using a hybrid evolutionary algorithm to form a colored graph.

According to one embodiment, the first graph includes a multitude of vertices. The system is further configured to generate a multitude of sub-graphs from the first graph. The system is further configured to decompose each of a first subset of the multitude of sub-graphs into at least three sets using the hybrid evolutionary algorithm, and merge the at least three sets to generate one of at least three colors for each one of the multitude of vertices.

According to one embodiment, the design includes a multitude of shapes. The system is further configured to assign each one of the multitude of shapes to a different one of at least three masks when a conflict is not detected after the decomposition. Each one of the at least three masks is associated with a different one of the at least three sets.

According to one embodiment, the system is further configured to generate a second graph representative of the design after detecting a conflict. The second graph is different from the first graph. The system is further configured to decompose the second graph into at least three sets using the hybrid evolutionary algorithm to form a second colored graph including at least three colors.

According to one embodiment, the second graph includes a multitude of vertices. The system is further configured to generate a second multitude of sub-graphs from the second graph, decompose each of a second subset of the second multitude of sub-graphs into at least three sets using the hybrid evolutionary algorithm, and merge the at least three sets to generate one of at least three colors for each one of the multitude of vertices of the second graph. The colored second graph is representative of the design.

According to one embodiment, the system is further configured to resolve the conflict by reworking the design to form a reworked design after detecting at least one conflict and a stop condition. The system is further configured to generate a second graph representative of the reworked design. The second graph is different from the first graph. The system is further configured to decompose the second graph into at least three sets using the hybrid evolutionary algorithm to form a second colored graph including at least three colors.

According to one embodiment, to decompose further configures the system to create a first coloring for the first subset by assigning one of at least three colors for each one of the multitude of vertices of the first subset using a randomized graph coloring heuristic. To decompose further configures the system to modify the first coloring using a randomized first local search algorithm so as to decrease a value associated with the number of at least one conflict, when a conflict exists, to make a second coloring solution. To decompose further configures the system to return the second coloring solution as the decomposed first subset of the multitude of sub-graphs when a condition defined by a first cost function is met. According to one embodiment, the system is further configured to randomly assign a color from a first three colors to a vertices having a color greater than three.

According to one embodiment, to decompose further configures the system to create a first multitude of candidate coloring solutions, and iteratively apply the hybrid evolutionary algorithm on the first multitude of candidate coloring solutions in accordance with the cost function to create a second multitude of candidate coloring solutions until a stopping criteria is met. To decompose further configures the system to select a coloring solution from the second multitude of candidate coloring solutions in accordance with a second cost function, and return the selected coloring solution as the decomposed first subset of the multitude of sub-graphs.

According to one embodiment, the stopping criteria includes at least one of a count of iterations. To apply the hybrid evolutionary algorithm configures the system to select a multitude of parents from the first multitude of candidate coloring solutions, and create at least one offspring from the multitude of parents by merging a multitude of color classes from the multitude of parents. To decompose further configures the system to complete the coloring of at least one offspring, apply a second local search to the at least one offspring in accordance with the second cost function, and replace at least one candidate coloring solution from the first multitude of candidate coloring solutions by the at least one offspring using a third cost function.

A better understanding of the nature and advantages of the embodiments of the present invention may be gained with reference to the following detailed description and the accompanying drawings.

BRIEF DESCRIPTION OF THE DRAWINGS

FIG. 4A depicts a design intent, which may not be printed using a triple-patterning process.

FIG. 4B depicts a graph corresponding to the design intent depicted in FIG. 4A.

DETAILED DESCRIPTION

In accordance with one embodiment of the present invention, a triple-patterning lithography is used to print complex design intents with higher pattern density than the pattern density provided by direct photolithographic printing or by double-patterning technology. In some embodiments, the design intent includes two-dimensional patterns that correspond to a circuit design implementing any logic, analog, or analog-digital function. The embodiments of the present invention may be applicable to multiple-patterning lithography technology with higher pattern density than triple-patterning for future process technologies.

Validating design intent for a triple-patterning process, in accordance with one embodiment of the present invention, includes determining whether a graph representative of the design intent is three-colorable. Each vertex in the graph may correspond to a shape in the design intent, and each edge in the graph may correspond to two shapes in the design intent that violate at least one design rule, such as being separated by a space that is less than a predetermined distance. The minimum spacing allowed between two shapes may depend on various parameters associated with the shapes. In some embodiments, the minimum allowable spacing between two shapes may be determined based on a set of design rules.

Determining whether a graph is three-colorable belongs to class of hard-to-solve computer problems, formally known as Nondeterministic-Polynomial-complete (NP-complete) problems. It is unlikely to have a fast algorithm to solve a NP-complete problem optimally, as is known. An algorithm and a system, in accordance with the present invention, relatively quickly and with a small probability of error solves the three-coloring problem associated with validating the design intent for a triple-patterning process.

When the algorithm or a system implementing the algorithm, collectively referred to herein as the "system", validates the design successfully, the shapes may be assigned to three masks to be used in a triple-patterning process. The design intent, however, may not be able to be partitioned into three masks due to the presence of unresolvable conflict edges. A conflict edge is defined as an edge whose end vertices are colored with the same color. In some cases the system may fail to do the validation successfully, in which case it will output a small number of conflict edges. The designer can analyze these conflict edges and adjust the coloring, if possible, to fix the conflicts. When it is not possible to adjust the coloring, the whole design intent needs a reworking Embodiments of the present invention provide a fast validation algorithm that has an acceptable failure rate that minimizes reworking the design intent.

Figure 1:
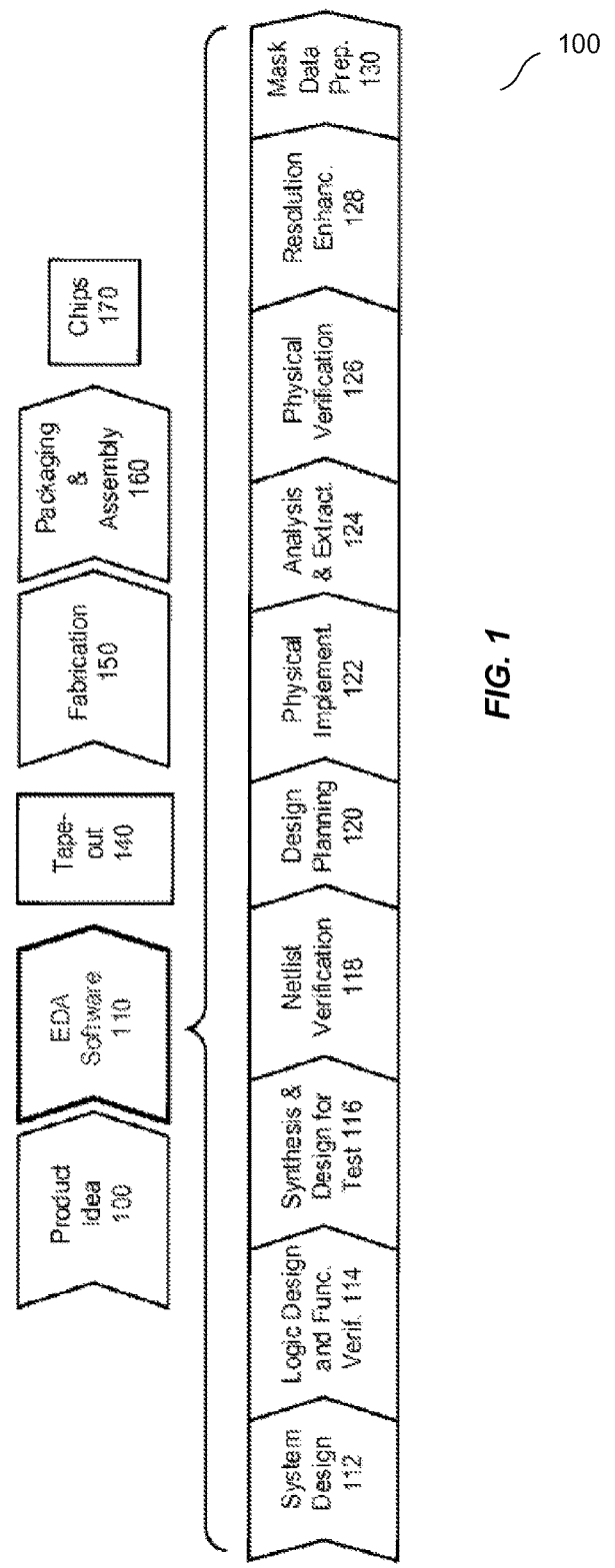
FIG. 1 depicts simplified exemplary steps in the design and fabrication of an integrated circuit.

FIG. 1 depicts simplified exemplary steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests can be designed and implemented to check the finished chips. In the netlist verification 118, the netlist can be checked for compliance with timing constraints and for correspondence with the HDL code. In the design planning 120, an overall floor plan for the chip can be constructed and analyzed for timing and top-level routing. Next, in the physical implementation 122, placement and routing can be performed.

In the analysis and extraction 124, the circuit functionality can be verified at a transistor level. In the physical verification 126, the design can be checked to correct any functional, manufacturing, electrical, or lithographic issues. In the resolution enhancement 128, geometric manipulations can be performed on the layout to improve manufacturability of the design. Finally, in the mask data preparation 130, the design can be taped-out 140 for production of masks to produce finished chips. The embodiments of the present invention may be used, for example at the steps of either physical verification 126 and/or mask data preparation 130.

Figure 2:
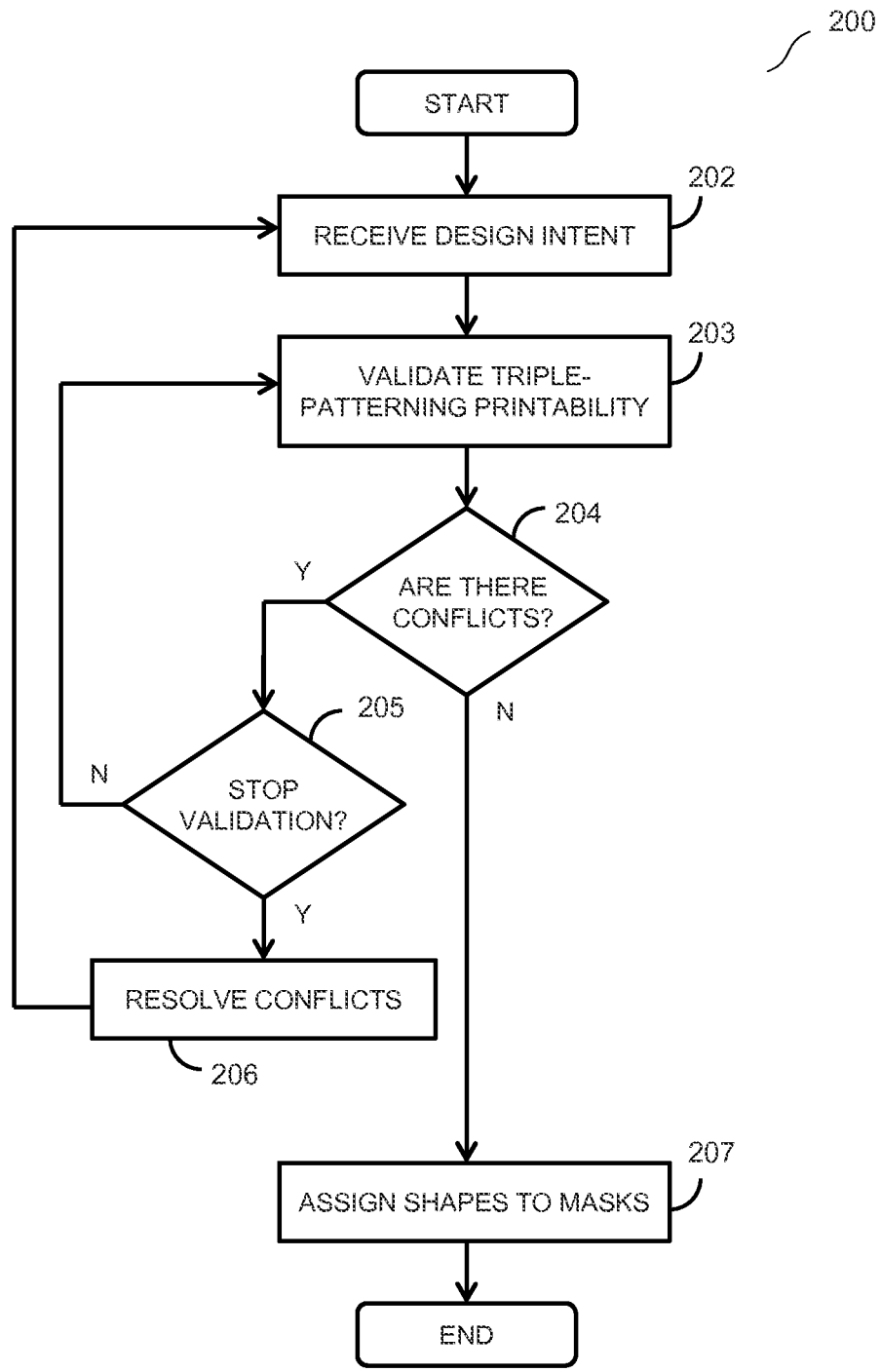
FIG. 2 depicts a simplified exemplary flowchart for validating a design intent using a triple-patterning process, in accordance with one embodiment of the present invention.

FIG. 2 depicts a simplified exemplary flowchart 200 for validating a design intent using a triple-patterning process, in accordance with one embodiment of the present invention. As discussed earlier, the triple-patterning design intent includes a multitude of shapes received 202 by the system. During validation 203 a graph is generated representative of the design intent. The graph may be decomposed into at least three color sets according to a hybrid-evolutionary population-search algorithm, as described further below, to generate a color for each vertex of the graph to form a colored graph including at least three colors, which is representative of the design intent. At 204, the results of validation generated in 203 are analyzed to determine whether any conflicts exit. If no conflicts are detected, the shapes in the design intent are assigned to three masks at 207; for example, the shapes that are associated with vertices of a first color can be assigned to the first mask. If conflicts are detected at 204, a stopping condition 205 is used to determine if the validation step needs to be performed again. A multitude of stopping conditions may be used. For example, one such condition may define limits on the run time of validation. Another condition may define a limit on the number of conflict outputs. Since the validation uses probabilistic calculations, repeated calls to the validation 203 may produce different conflict outputs. If the stopping condition is reached with conflicts, the designer tries to resolve 206 conflicts. Resolution of such conflicts may be carried out by reworking the design intent, which in turn may include moving or changing the shapes. After rework of design intent to resolve 206 conflicts, the new design intent is received again at 202.

Figure 3A:
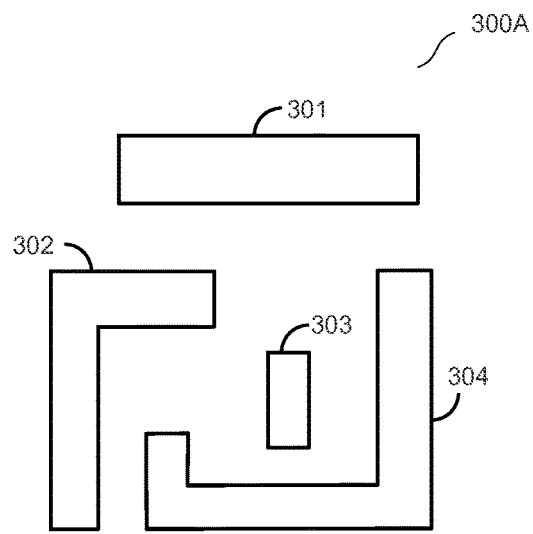
FIG. 3A depicts a simplified exemplary design intent including 4 shapes.
Figure 3B:
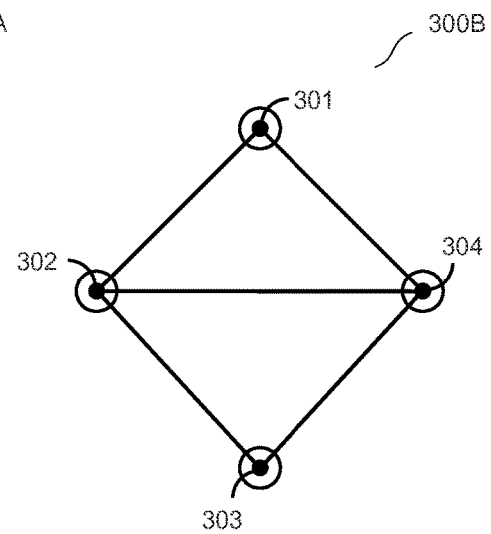
FIG. 3B depicts simplified exemplary construction of a graph including vertices associated with the design intent depicted in FIG. 3A, in accordance with one embodiment of the present invention.
Figure 3C:
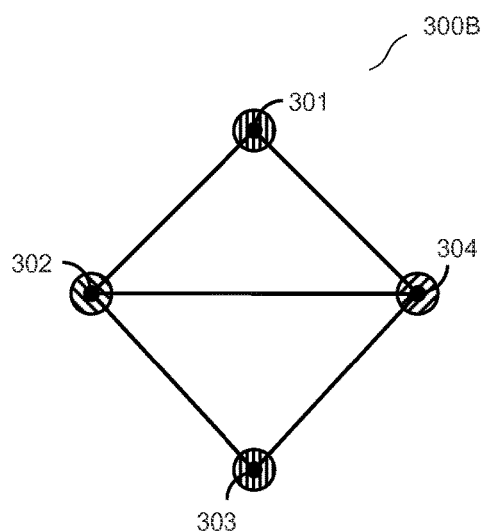
FIG. 3C depicts a simplified exemplary three-coloring of the graph depicted in FIG. 3B, in accordance with one embodiment of the present invention.
Figure 3D:
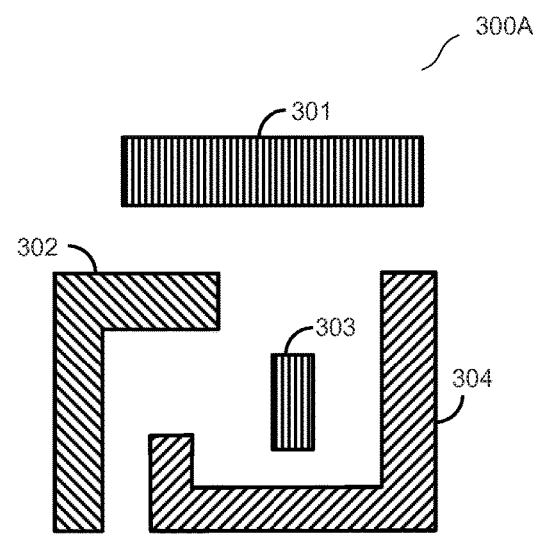
FIG. 3D depicts a simplified exemplary assignment of the design shapes depicted in FIG. 3A and graph vertices depicted in FIG. 3A and FIG. 3C to three masks, in accordance with one embodiment of the present invention.

FIG. 3A depicts a simplified exemplary design intent 300A including 4 shapes 301, 302, 303, and 304. FIG. 3B depicts simplified exemplary construction of a graph 300B including vertices 301, 302, 303, and 304 associated respectively with shapes 301, 302, 303, and 304 in FIG. 3A, in accordance with one embodiment of the present invention. During the graph construction, two shapes are connected by a line, hereinafter also referred to as an "edge", if there is a design rule violation such as a spacing constraint between them; in other words the two shapes may not be assigned to the same mask. For example, shapes 301 and 302 in design intent 300A may not be assigned to the same mask, hence a line is connected between vertices 301 and 302 in graph 300B. FIG. 3C depicts a simplified exemplary three-coloring of the graph depicted in FIG. 3B, in accordance with one embodiment of the present invention. FIG. 3C depicts vertices 301 and 303 are assigned one color, vertex 302 is assigned a second color, and vertex 304 is assigned a third color. FIG. 3D depicts a simplified exemplary assignment of the design shapes depicted in FIG. 3A and graph vertices depicted in FIG. 3C to three masks, in accordance with one embodiment of the present invention. FIG. 3D depicts shapes 301 and 303 are assigned to one mask, shape 302 is assigned to a second mask, and shape 304 is assigned to a third mask.

FIG. 4A depicts a design intent 400A, which may not be printed using a triple-patterning process. FIG. 4B depicts a graph 400B corresponding to the design intent depicted in FIG. 4A. Referring simultaneously to FIG. 3C and FIG. 4B, graph 400B is not three-colorable no matter how the vertices are colored with three colors as is evident by comparing colored graph 300B with graph 400B, which includes an additional edge 410 constraint between vertices 401, 403. Since the vertices at the ends of each edge of the graph should be different colors to be colorable successfully, vertices 401, 403, which have the same coloring in this example, generate a conflict because of the added edge 410 between them. In such non-colorable graph cases, hereinafter also referred to as a "conflict", the designer should rework the design intent to resolve the conflict. Such rework may include moving or changing the shapes.

Figure 5:
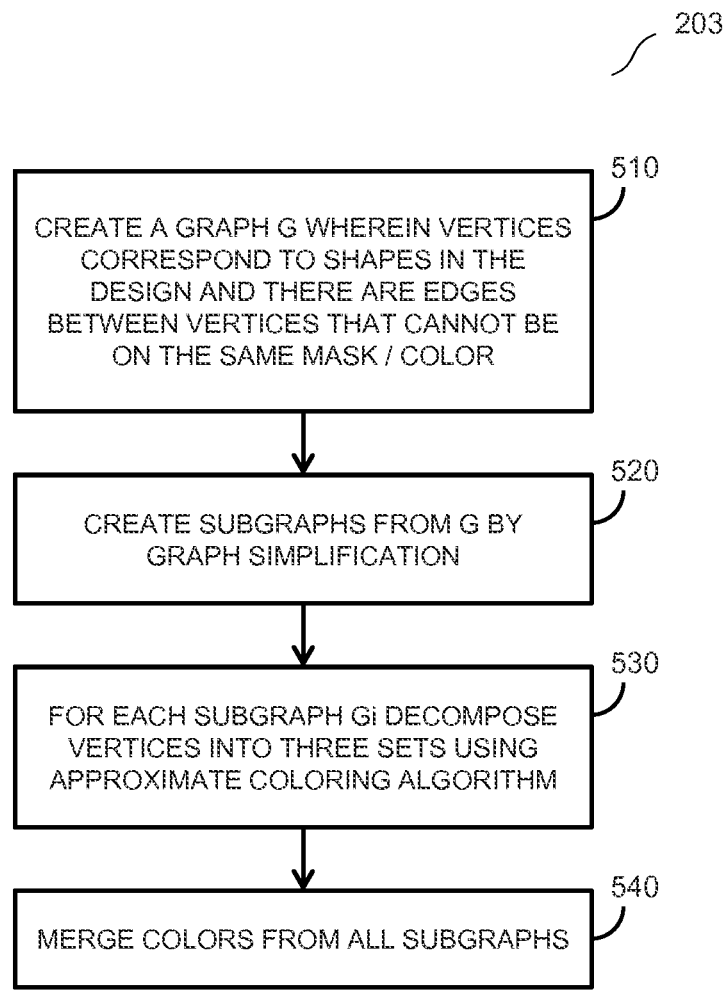
FIG. 5 depicts a simplified exemplary flowchart for validating triple patterning printability as depicted in FIG. 2, in accordance with one embodiment of the present invention.

FIG. 5 depicts a simplified exemplary flowchart 203 for validating triple patterning printability as depicted in FIG. 2, in accordance with one embodiment of the present invention. Flowchart 203 may be used to determine triple-patterning decomposability of a given design intent. Flowchart 203 depicts a graph G representative of the design intent is created 510 or generated by the computer. Vertices of graph G correspond to, or are associated with, the multitude of shapes in the design. An edge is added between two vertices when that pair of vertices may not be on the same mask due to design rule violation, such as a minimum spacing rule violation.

Graph G may be divided into a multitude of sub-graphs Gi created 520 or generated using graph simplification methods that do not degrade the future coloring solution quality. Graph simplification methods include connected component decomposition, bi-connected component decomposition and hiding of vertices with degree less than three. Vertices in a subset of the multitude of sub-graphs Gi are decomposed 530 into at least three color sets using a fast approximate coloring algorithm as described below. The at least three color sets of the sub-graphs are merged 540 to generate one of at least three colors for each one of the multitude of vertices in graph G to form the coloring of graph G.

Figure 6:
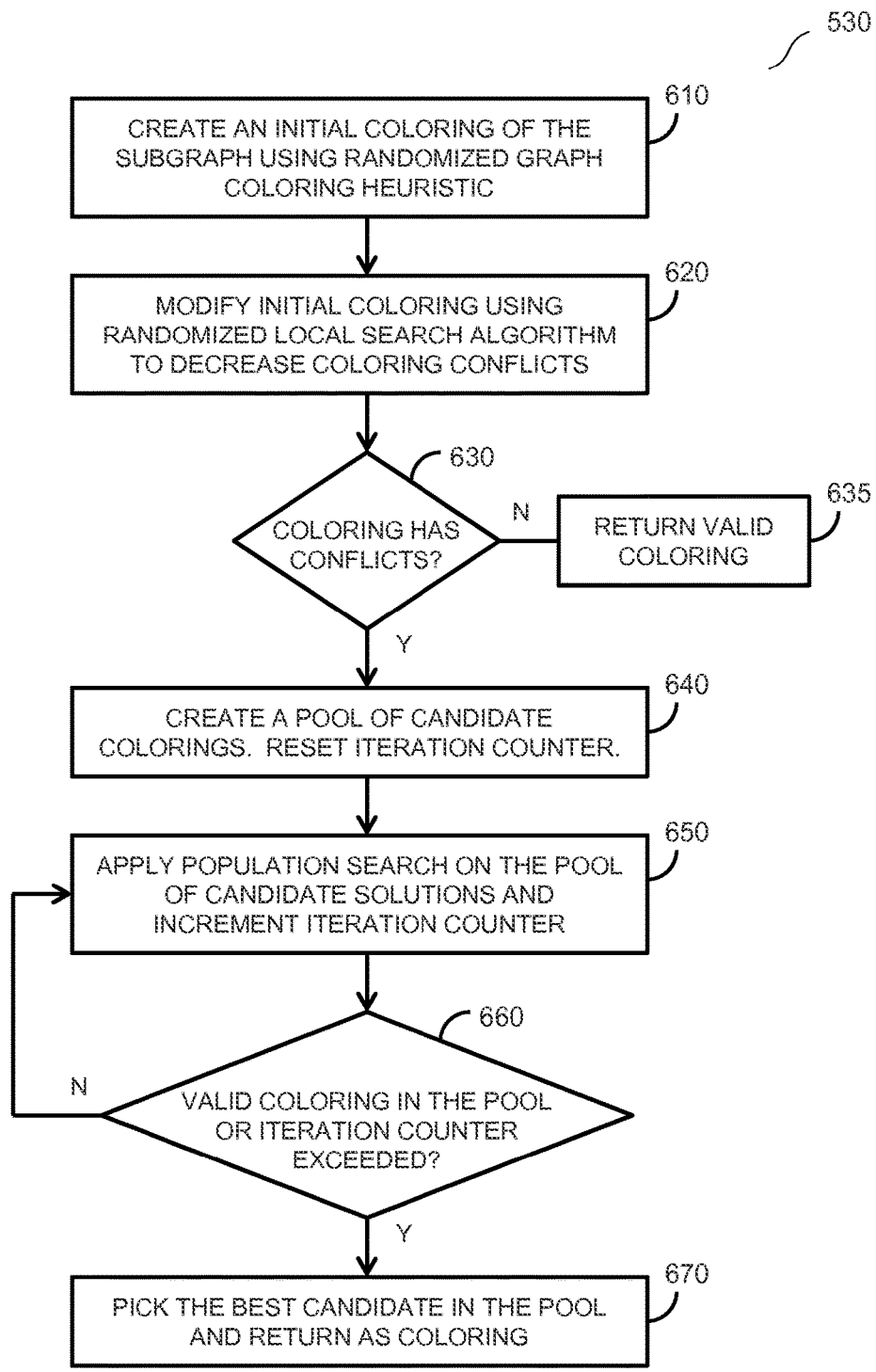
FIG. 6 depicts a simplified exemplary flowchart for decomposing vertices using an approximate coloring algorithm as depicted in FIG. 5.

FIG. 6 depicts a simplified exemplary flowchart for decomposing vertices using an approximate coloring algorithm 530 as depicted in FIG. 5. FIG. 6 depicts an initial coloring of each sub-graph Gi is created 610 using a randomized graph coloring heuristic. Examples of graph coloring heuristics include Recursive Largest First algorithm, degree of saturation (DSATUR) algorithm, sequential vertex coloring algorithm or any other existing coloring algorithm with polynomial time complexity. Such heuristics may use more than three (3) colors to color the sub-graphs. Vertices having invalid colors (colors greater than 3) are randomly assigned a color from the first three valid colors (i.e., color 1-color 3). The resulting 3-coloring of the sub-graphs may thus have conflicts.

Next, the initial coloring is modified 620 or processed using a randomized local search algorithm, such as the Tabu Search and Simulated Annealing algorithms. Such randomized local search algorithms improve the coloring by performing a neighborhood search guided by a cost function that defines the quality of the coloring. Possible cost functions for a coloring include cost functions characterized by the number of conflicting edges, the number of conflicting vertices, or any combinations of such functions. Cost functions may also include other criteria such as distribution of colors. After modifying the initial coloring 620 is completed, the coloring is returned 635 as a valid coloring of the sub-graph when it is free of conflicts.

When the coloring has conflicts at 630 or otherwise fails to satisfy one or more conditions or criteria, such as color distribution uniformity, a hybrid-evolutionary population based search is performed for color selection on a pool of candidate solutions, as described further below. A pool or a multitude of candidate coloring solutions is created 640 or generated using, for example, a coloring heuristic, such as that described at 610. In one embodiment, coloring heuristic randomly assigns colors to vertices and processes this coloring using a local search, that may be similar to the local search at 620. In another embodiment, configurations of the coloring heuristics used at 640 may be different from those at 610 and 620; for example, they may have different cost functions. Cost functions may be defined by the number of conflicts, the number of conflicting vertices, and the like. Each candidate solution in the pool is a coloring of subgraph Gi.

A hybrid-evolutionary population search algorithm is applied 650 or performed on the pool of candidate solutions until one or more stopping conditions or criteria such as exceeding 660 an iteration counter is met. Stopping criteria may be defined by finding a legal coloring, i.e. no coloring conflict is detected, exceeding the maximum number of iterations of population search, or reaching some other criteria of coloring quality. At 670 the solution candidate with the highest quality, defined in accordance with a cost function, is selected and returned as the coloring of graph G, i.e. as the decomposed first subset of the plurality of subgraphs.

Figure 7:
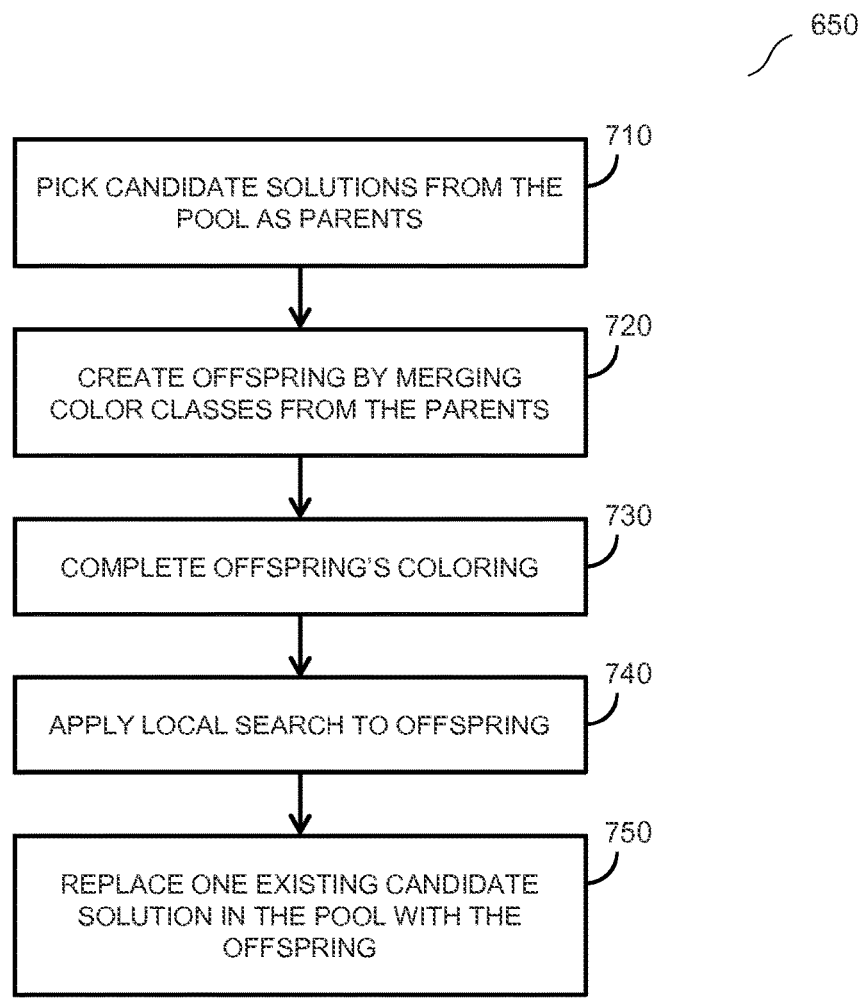
FIG. 7 depicts a simplified exemplary flowchart for applying the population search on the pool of candidate solutions as depicted in FIG. 6, in accordance with one embodiment of the present invention.

FIG. 7 depicts a simplified exemplary flowchart 650 for applying the population search, i.e. the hybrid evolutionary algorithm, on the pool of candidate solutions as depicted in FIG. 6, in accordance with one embodiment of the present invention. A multitude of candidate coloring solutions in the pool of candidate coloring solutions are picked 710 or selected to become the multitude of parents. Such selection from the pool of candidate coloring solutions may be uniformly random, or biasing the selection towards higher quality candidate solutions according to a cost function, thus requiring additional computations. A new candidate solution, hereinafter also referred to as "offspring", is created 720 or generated by merging the color classes of the selected solution candidates, i.e. parents. Each color class of a coloring is a set of vertices assigned to the same color in that coloring. For example, referring to FIG. 3C, color classes are {301, 303}, {302}, {304}. Merging of color classes from the selected candidate solutions results in the generation of new candidate solutions, thereby facilitating cooperation between the candidate solutions.

For example, Tables 1-5 show merging of the color classes from the parents, in which an example sub-graph is presented, which includes ten (10) vertices numbered from one (1) to ten (10). Table 1 below shows a selection of candidate solutions, denoted as Parent 1 and Parent 2. Each color class is shown between a pair of curly brackets, i.e. { }.

TABLE 1

|  | Color 1 | Color 2 | Color 3 |
|---|---|---|---|
| Parent 1 | {1, 5, 8, 10} | {3, 4, 6} | {2, 7, 9} |
| Parent 2 | {1, 3, 5} | {2, 4, 7} | {6, 8, 9, 10} |

In Table 2 below, the first color class, Color 1, of the offspring is taken, i.e. shown in italics, from Parent 1 because it is the largest of the color classes not previously taken. Vertices in this class Color 1 from Parent 1 are marked as unavailable, i.e. shown between a pair of straight brackets, i.e. [ ], in Parent 2.

TABLE 2

|  | Color 1 | Color 2 | Color 3 |
|---|---|---|---|
| Parent 1 | {*1, 5, 8, 10*} | {3, 4, 6} | {2, 7, 9} |
| Parent 2 | {[1], 3, [5]} | {2, 4, 7} | {6, [8], 9, [10]} |
| Offspring | {*1, 5, 8, 10*} | | |

Table 3 below shows how the offspring for the second color class, i.e. Color 2, are built by being taken, i.e. shown in italics, from the largest color class of the previously unselected parent, i.e. Parent 2. Parent 2 was used to select the second color class because vertices of the offspring may be combined to form coloring solutions from multiple parents. Vertices selected for Color 2 and previously selected vertices are marked as unavailable in Parent 1.

TABLE 3

|  | Color 1 | Color 2 | Color 3 |
|---|---|---|---|
| Parent 1 | {[1, 5, 8, 10]} | {3, [4], 6} | {[2, 7], 9} |
| Parent 2 | {[1], 3, [5]} | {*2, 4, 7*} | {6, [8], 9, [10]} |
| Offspring | {1, 5, 8, 10} | {*2, 4, 7*} | |

As shown in Table 4 below, the third color class, i.e. Color 3, of the offspring is again taken from Parent 1 because Parent 1 still includes the largest number of vertices remaining in a color class, i.e. two vertices, in Color 2. Alternatively, vertices 6, 9 from Parent 2 may have been selected since the number of vertices is also two, however since vertices were previously taken from Parent 2 the vertices are taken now from Parent 1, in alternating fashion if the number of remaining vertices in a color class is equal between parent choices.

TABLE 4

|  | Color 1 | Color 2 | Color 3 |
|---|---|---|---|
| Parent 1 | {[1, 5, 8, 10]} | {*3, [4], 6*} | {[2, 7], 9} |
| Parent 2 | {[1, 3, 5]} | {[2, 4, 7]} | {6, [8], 9, [10]} |
| Offspring | {1, 5, 8, 10} | {2, 4, 7} | {*3, 6*} |

In an alternative embodiment, other methods of merging color classes may include using more than two parents. Furthermore, in other embodiments, a subset of the selected color class from the parent (instead of the whole color class) may be used.

After all three color classes of the offspring are transferred from parents, some of the vertices may remain unassigned, which may result in an incomplete coloring, such as for example vertex 9 in Table 4. Accordingly, each of such unassigned vertices are put into one of the color classes of the offspring at random to complete 730 the coloring of the offspring. For example, in Table 5 below, unassigned vertex 9, shown in bold, is assigned to Color 3.

TABLE 5

|  | Color 1 | Color 2 | Color 3 |
|---|---|---|---|
| Parent 1 | {[1, 5, 8, 10]} | {[3, 4, 6]} | {[2, 7], 9} |
| Parent 2 | {[1, 3, 5]} | {[2, 4, 7]} | {6, [8], 9, [10]} |
| Offspring | {1, 5, 8, 10} | {2, 4, 7} | {3, 6, 9} |

The offspring is then processed with a local search at 740 to improve its quality. At 750, after the local search, the offspring replaces an existing candidate solution in the pool in 750 as a new candidate solution. Because the population search includes a local search, the algorithm is called a hybrid-evolutionary algorithm. Selection of the candidate solution for replacement may be based on cost functions such as replacing the lowest quality candidate, random selection or having high similarity to the new solution candidate, i.e. the offspring.

Figure 8A:
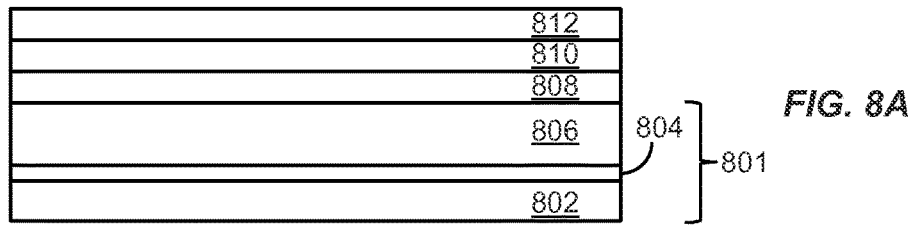
FIGS. 8A-8W depict simplified exemplary cross-sections of a process flow using a triple-patterning process, in accordance with one embodiment of the present invention.
Figure 8B:
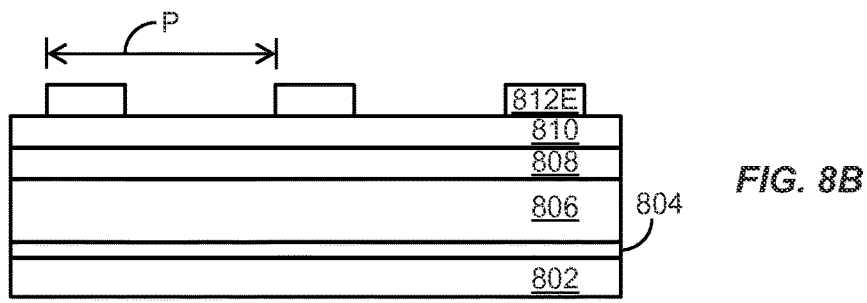
Figure 8C:
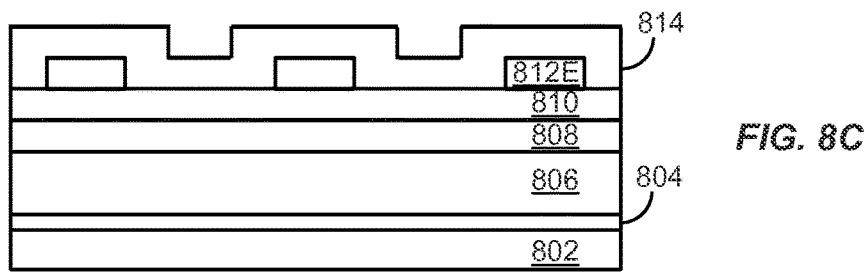
Figure 8D:
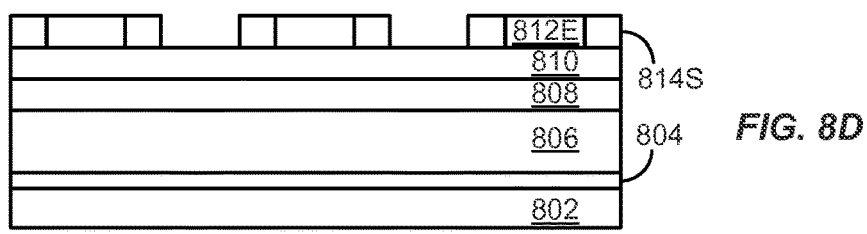
Figure 8E:
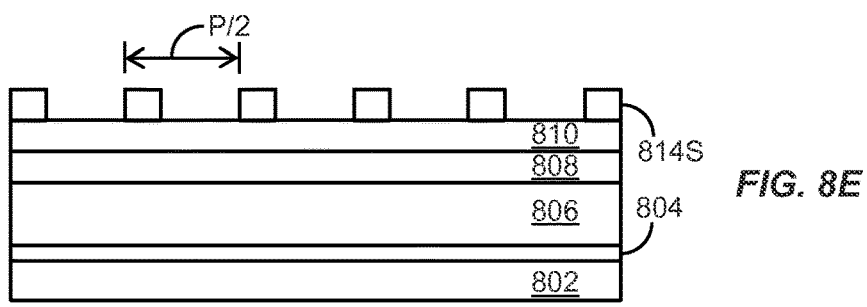
Figure 8F:
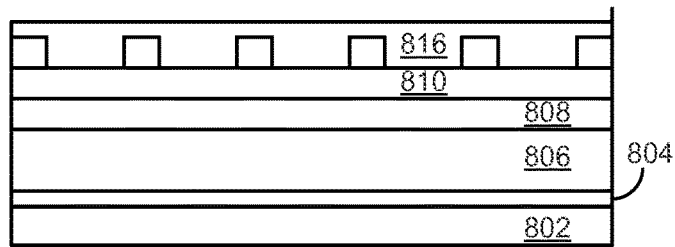
Figure 8G:
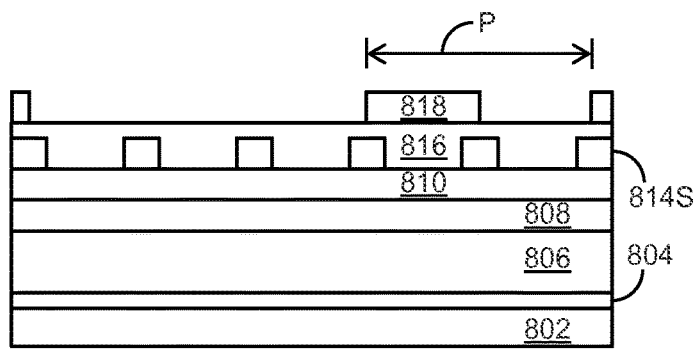
Figure 8H:
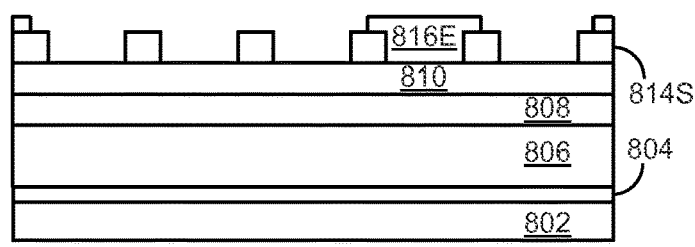
Figure 8I:
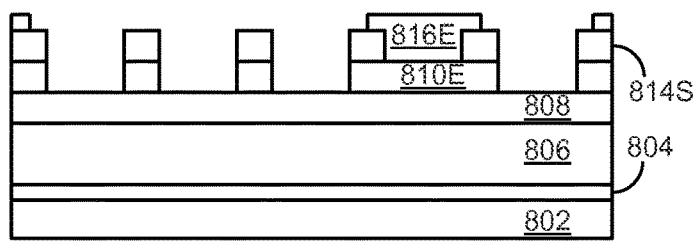
Figure 8J:
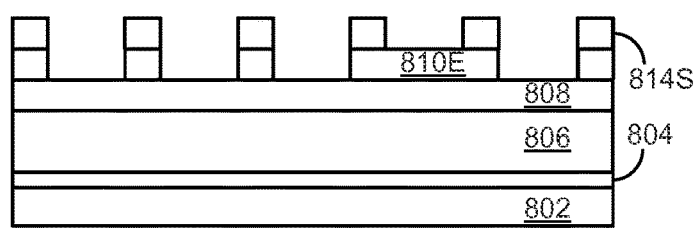
Figure 8K:
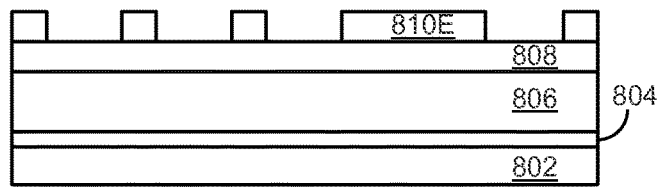
Figure 8L:
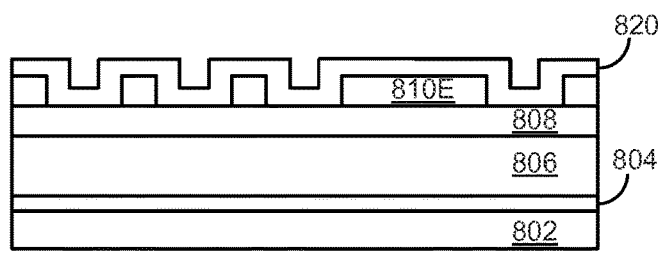
Figure 8M:
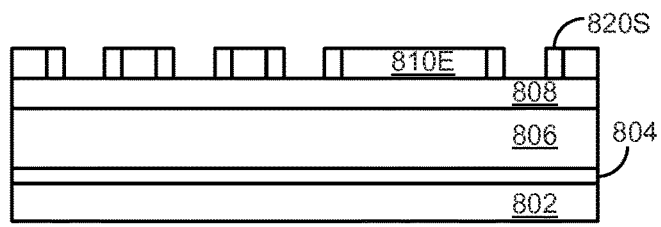
Figure 8N:
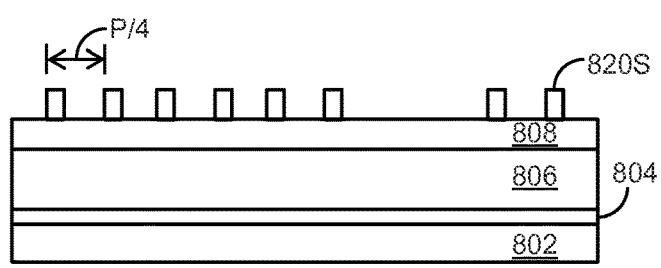
Figure 8O:
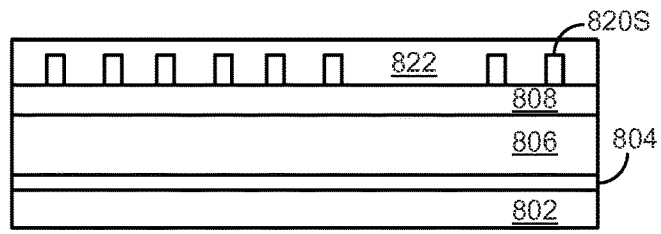
Figure 8P:
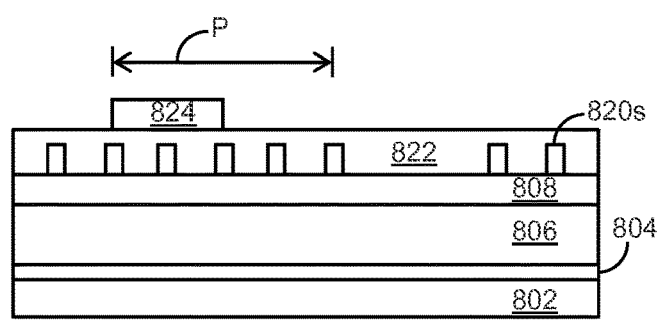
Figure 8Q:
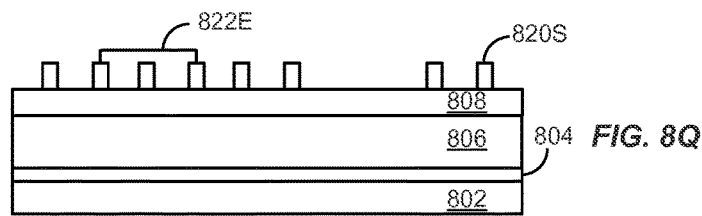
Figure 8R:
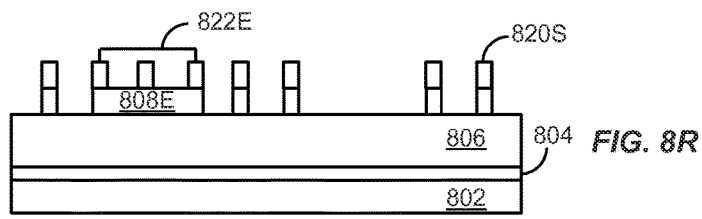
Figure 8S:
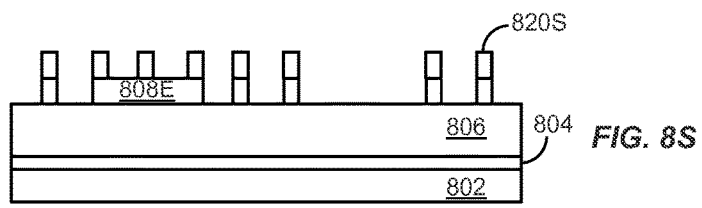
Figure 8T:
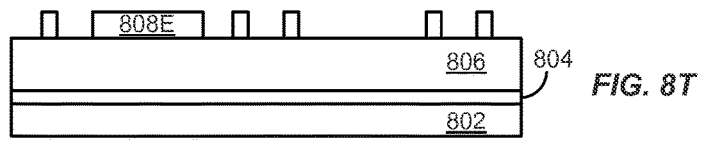
Figure 8U:
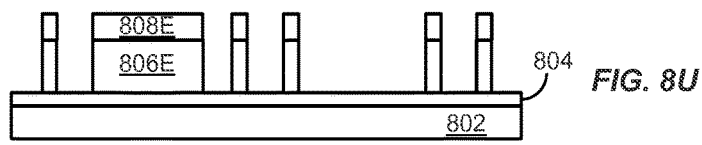
Figure 8V:
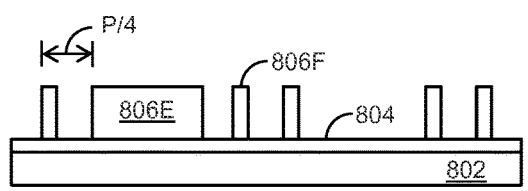
Figure 8W:
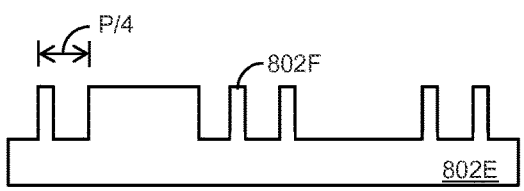
Figure 9:
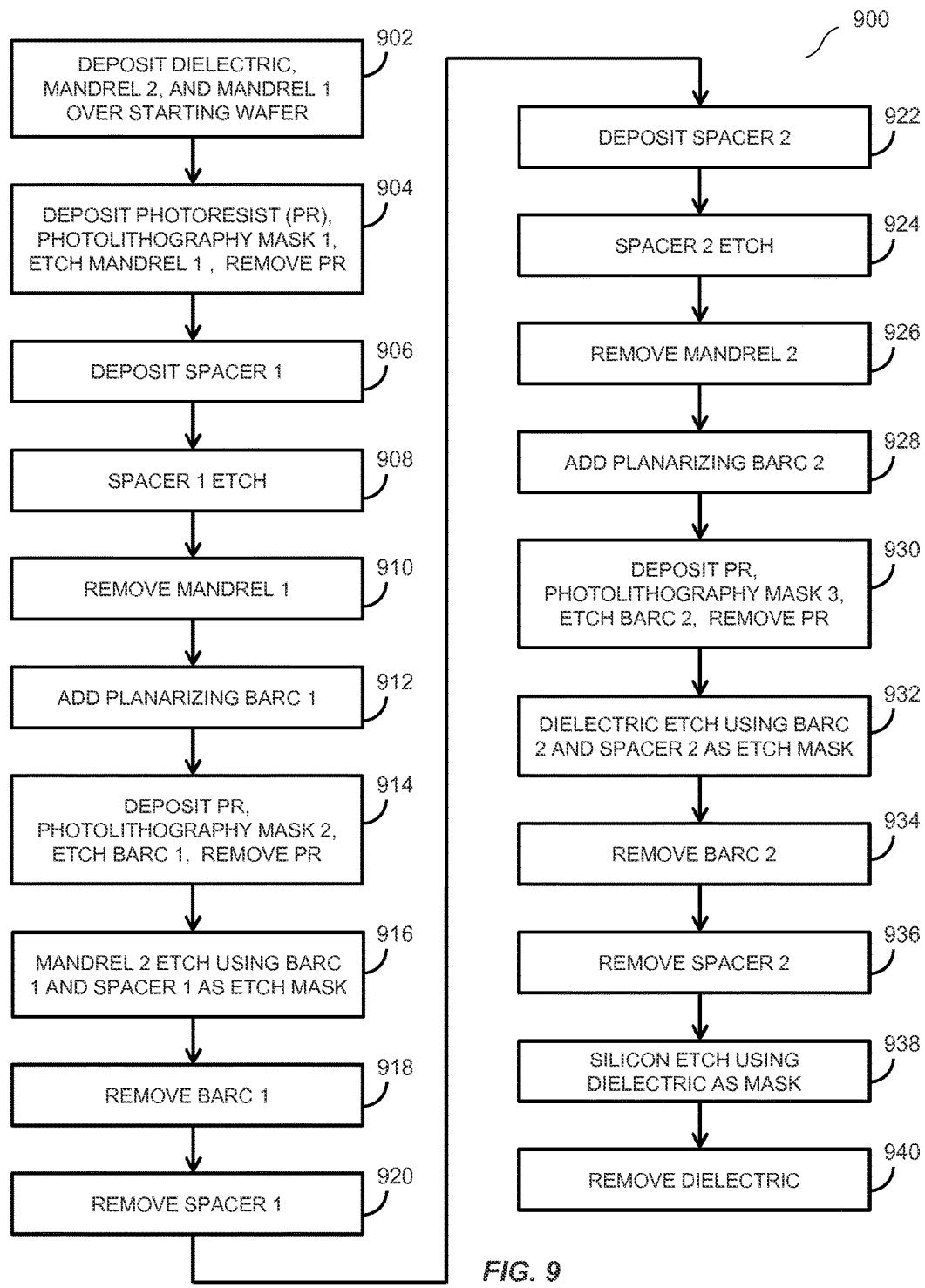
FIG. 9 depicts a simplified exemplary flowchart for the process flow depicted in FIGS. 8A-8W, in accordance with one embodiment of the present invention.

FIGS. 8A-8W depict simplified exemplary cross-sections of a process flow using a triple-patterning process, in accordance with one embodiment of the present invention. FIG. 9 depicts a simplified exemplary flowchart 900 for the process flow depicted in FIGS. 8A-8W, in accordance with one embodiment of the present invention. Referring simultaneously to FIGS. 8A-8W and FIG. 9, a starting wafer 801 may include a thin dielectric layer 804, also referred to herein as a buried oxide (BOX), formed between a silicon substrate 802 and a crystalline silicon layer 806. Crystalline silicon layer 806 may be formed by bonding a second single crystal silicon wafer to another first single crystal silicon wafer that was previously oxidized and then cutting the second single crystal silicon wafer to the thickness desired for crystalline silicon layer 806. In an alternative embodiment, starting wafer 801 may include a single crystal silicon wafer without the BOX processing. The following description will refer to the BOX process flow by example, however as will be seen, it is understood that a single crystal silicon wafer without the BOX processing may be used in an alternative embodiment.

As depicted in FIG. 8A, a multitude of layers including layers with different etching characteristics may be deposited 902 so as to overlay crystalline silicon layer 806. For example, a dielectric layer 808 may be deposited to overlay crystalline silicon layer 806 followed by depositing a mandrel 2 layer 810 to overlay dielectric layer 808. Then, a mandrel 1 layer 812 may be deposited to overlay mandrel 2 layer 810. In alternative embodiments, different layers than those described above may be used, such as for example a greater number of layers than the three deposited layers described above may be used depending on the etching characteristics of the layers used.

After the deposition 902 of the multitude of layers, a photolithography sequence 904 applies photoresist (PR) (not shown), exposes the PR using a mask 1, develops the PR, and etches mandrel 1 layer 812, and removes the PR leaving the pattern of mask 1 in mandrel 1 pattern 812E as depicted in FIG. 8B. Various alternative steps for the photolithography sequence are possible. The pattern of mask 1 in mandrel 1 pattern 812E may include a pattern having a minimum process technology pitch, P, as shown by the arrow that includes the sum of a minimum line and minimum space. In other words, although the line within P may be processed wider or narrower, the sum of the line and space within P may not be processed any smaller for this technology example using just one photolithography sequence using just one mask.

Next, a spacer 1 layer 814 may be deposited 906 in conformal fashion so as to overlay the mandrel 1 pattern 812E as depicted in FIG. 8C. Then, spacer 1 layer 814 may be etched 908 so as to leave behind spacers 1 structures 814S at the sidewalls of mandrel 1 pattern 812E as depicted in FIG. 8D. Then, mandrel 1 pattern 812E may be removed 910 as depicted in FIG. 8E. It should be noted that the pitch in spacers 1 structures 814S may be about half of P as shown by the arrows. Next, a planarizing bottom anti-reflective coating 1 (BARC 1) layer 816 may be added 912 so as to overlay spacers 1 structures 814S and mandrel 2 layer 810 as depicted in FIG. 8F.

Then, a second photolithography sequence 914 applies a PR layer, exposes the PR using a mask 2, develops the PR leaving PR pattern 818, which again may be patterned with pitch P as shown by the arrows in FIG. 8G. BARC 1 layer 816 may be etched leaving BARC 1 pattern 816E after PR removal as depicted in FIG. 8H. Next, mandrel 2 layer 810 may be etched 916 using BARC 1 pattern 816E and spacers 1 structures 814S as hard-masks leaving behind mandrel 2 pattern 810E as depicted in FIG. 8I. Then, BARC 1 pattern 816E may be removed 918 as depicted in FIG. 8J. Next, FIG. 8K depicts the cross-section after spacers 1 structures 814S are removed 920 and provide patterns having about one half the pitch available using a single photolithography mask.

Next, a spacer 2 layer 820 may be deposited 922 in conformal fashion so as to overlay the mandrel 2 pattern 810E as depicted in FIG. 8L. Then, spacer 2 layer 820 may be etched 924 so as to leave behind spacers 2 structures 820S at the sidewalls of mandrel 2 pattern 810E as depicted in FIG. 8M. Then, mandrel 2 pattern 810E may be removed 926 as depicted in FIG. 8N. It should be noted that the pitch in spacers 2 structures 820S may be about one fourth of P as shown by the arrows. Next, a planarizing bottom anti-reflective coating 2 (BARC 2) layer 822 may be added 928 so as to overlay spacers 2 structures 820S and dielectric layer 808 as depicted in FIG. 8O.

Then, a third photolithography sequence 930 applies a PR layer, exposes the PR using a mask 3, develops the PR leaving patterned PR layer 824, which again may be patterned with pitch P as shown by the arrows in FIG. 8P. BARC 2 layer 822 may be etched leaving BARC 2 pattern 822E after PR removal as depicted in FIG. 8Q. Next, dielectric layer 808 may be etched 932 using BARC 2 pattern 822E and spacers 2 structures 820S as hard-masks leaving behind dielectric pattern 808E as depicted in FIG. 8R. Then, BARC 2 pattern 822E may be removed 934 as depicted in FIG. 8S. Next, FIG. 8T depicts the cross-section after spacers 2 structures 820S are removed 936. Then dielectric pattern 808E may be used as a hard mask to etch 938 crystalline silicon layer 806 as depicted in FIG. 8U. Next, dielectric pattern 808E may be removed as depicted in FIG. 8V leaving crystalline silicon pattern 806E, which in-turn includes crystalline silicon fins 806F. In an alternative embodiment, when the single crystal silicon wafer without the BOX processing may be used, the processing sequence of steps 904 through 940 may be similar, resulting in the cross-section depicted in FIG. 8W, which includes crystalline silicon pattern 802E, which in-turn includes crystalline silicon fins 802F.

The resulting patterns in crystalline silicon patterns 806E and 802E may be complex, including sections without fins where the crystalline silicon layer 806 or crystalline silicon substrate 802 are not etched, i.e. pedestals or plateaus, and sections where the crystalline silicon layer 806 is etched away or crystalline silicon substrate 802 is etched forming a wide trench. Further, the resulting patterns in crystalline silicon patterns 806E and 802E may include a pitch that is about one fourth the pitch available using just a single mask. Thus, the pitch achievable using triple-patterning technology may be about half the pitch achievable using double-patterning technology and about one fourth the pitch achievable using a single mask, which leads to greater density integrated circuits using triple patterning, as depicted by the arrows in FIG. 8V and FIG. 8W.

The complex crystalline silicon patterns 806E and 802E are made possible, in-part, because of the validation embodiments of the present invention referred to in FIG. 2 through FIG. 7, which may be performed for the design intents and associated shapes used in mask 1 through mask 3 referenced in FIGS. 8B, 8G, 8P and associated respective photolithography sequences 904, 914, 930 referenced in FIG. 9. The crystalline silicon fins 806F, 802F depicted in FIG. 8V and FIG. 8W may be subsequently used in the fabrication of three dimensional transistors such as fin-FETs or triple-gate FETs requiring smaller pitch than that available using a single mask or double patterning technology. In alternative embodiments, other process flows may be used to analogously form structures such as gates for other types of transistors as well as metal interconnects using a metal trench fill and chemical mechanical polish CMP planarization process.

Figure 10:
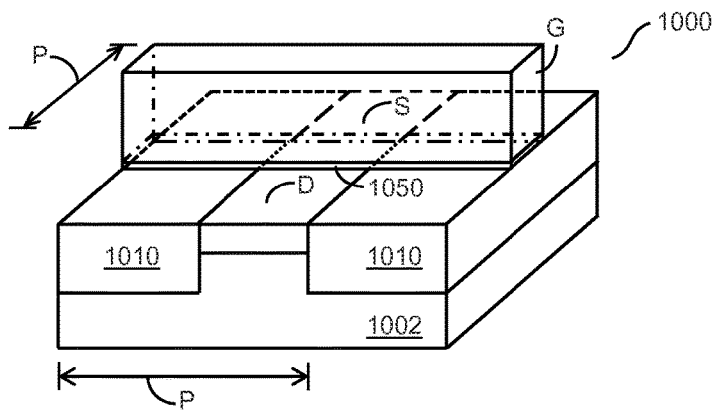
FIG. 10 depicts a simplified exemplary perspective view of an insulated-gate field-effect-transistor (IG-FET).

FIG. 10 depicts a simplified exemplary perspective view of an insulated-gate field-effect-transistor (IG-FET) 1000. IG-FET 1000 may include a crystalline silicon substrate 1002, shallow trench isolation 1010 (STI dielectric) formed on each side of a crystalline silicon pedestal, a gate dielectric 1050 formed between the crystalline silicon pedestal and a gate, G, formed as a stripe running lengthwise in the plane of FIG. 10 and over STI 1010. IG-FET 1000 may further include source S and drain D regions formed by implanting dopant atoms into the crystalline silicon pedestal in self aligned fashion on each side of gate G. The minimum pitch P normally available for the STI/crystalline silicon pedestal and/or the gate patterns is depicted by arrows. The circuit density achievable is thus limited in-part by pitch P. The power wasted by IG-FET 1000 may be limited by leakage currents between D and S that are not under the control of G and may in aggregate over a multitude of transistors further limit circuit density.

Figure 11:
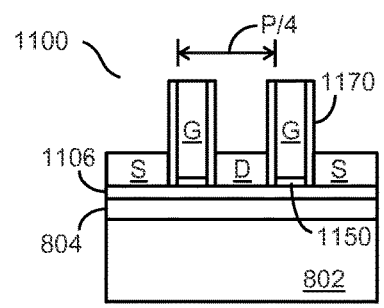
FIG. 11 depicts a simplified exemplary cross-section view of a fully-depleted silicon-on-insulator (FDSOI) FET manufactured using a triple-patterning process, in accordance with one embodiment of the present invention.

FIG. 11 depicts a simplified exemplary cross-section view of a fully-depleted silicon-on-insulator (FDSOI) FET 1100 manufactured using a triple-patterning process, in accordance with one embodiment of the present invention. FDSOI FET 1100 may include a starting wafer similar to starting wafer 801 referenced above in FIG. 8A except overlying BOX layer 804, a crystalline silicon layer 1106 includes a thickness that may be thinner than crystalline silicon layer 806 used for fin-FET manufacture. FDSOI FET 1100 may further include a pair of connected gates G. In accordance with one embodiment of the present invention, the design intent used to form pair of connected gates G may be validated and patterned using the triple patterning embodiments described herein with a pitch P/4 as depicted by the arrows to increase circuit density. Pair of connected gates G may have spacers 1170 formed between the gates G and raised doped silicon S and D regions. FDSOI FET 1100 may have reduced leakage characteristics because the silicon channel region immediately below the gates G may be formed thinner using a thin crystalline silicon layer 1106 so as to be fully depleted by the gates G when FDSOI FET 1100 is biased off.

Figure 12:
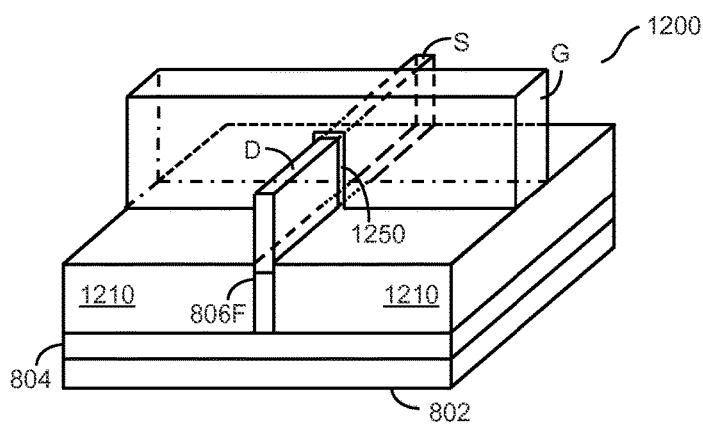
FIG. 12 depicts a simplified exemplary perspective view of a fin-FET transistor.

FIG. 12 depicts a simplified exemplary perspective view of a fin-FET transistor 1200. FinFET transistor 1200 may include starting wafer 801 referenced above in FIG. 8A, fin 806F referenced in FIG. 8V, STI regions 1210, gate G formed overlaying and surrounding the portion of fin 806F above STI 1210, gate dielectric 1250 between the portion of fin 806F above STI 1210 and gate G, and S and D doped regions in the portion of fin 806F slightly below the surface of STI 1210 and on each side of gate G. The channel region may deplete fully when the gate is biased off because fin 806F is narrow and the gate surrounds the channel on at least two sides. Analogous fin-FET structures may be formed using the starting wafer 801 without BOX processing as described in reference to FIG. 8W.

Figure 13:
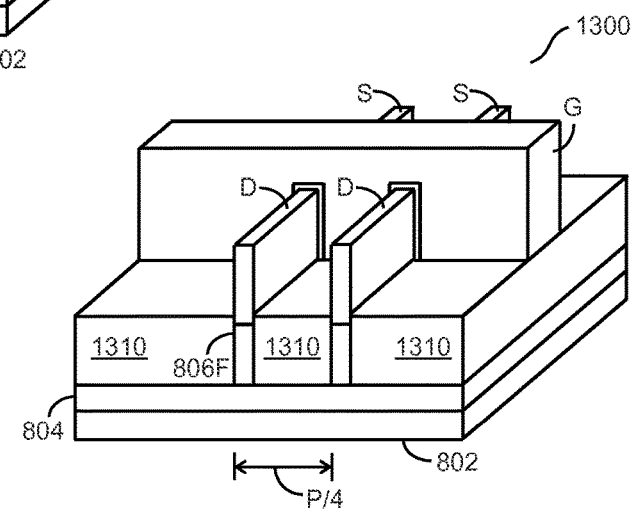
FIG. 13 depicts a simplified exemplary perspective view of a fin-FET transistor manufactured, in part, using the triple-patterning process depicted in FIGS. 8A-8W and FIG. 9, in accordance with one embodiment of the present invention.

FIG. 13 depicts a simplified exemplary perspective view of a fin-FET transistor 1300 manufactured, in part, using the triple-patterning process depicted in FIGS. 8A-8W and FIG. 9, in accordance with one embodiment of the present invention. Fin-FET transistor 1300 may include a pair of fins 806F with S and D respectively connected in parallel to form a single FET with double the current drive capability compared to fin-FET transistor 1200. STI 1310 may be formed on each side of the pair of fins 806F. Pair of fins 806F may be manufactured with pitch P/4, as depicted by the arrows, using triple patterning technology as depicted in FIG. 8V or FIG. 8W providing higher circuit density that achievable using single mask or double-patterning technology. The design intent used to form the pair of parallel connected fins 806F may be validated using the triple-patterning embodiments of the present invention referred to in FIG. 2 through FIG. 7. The triple-patterning validation for fin-FET transistor 1300 may be performed on the design intents and associated shapes used in mask 1 through mask 3 referenced in FIGS. 8B, 8G, 8P before the triple-patterning wafer process for associated respective photolithography sequences 904, 914, 930 referenced in FIG. 9. It would be understood that fins 802F referenced in FIG. 8W may be used optionally replacing fins 806F when BOX processing is not used.

Figure 14:
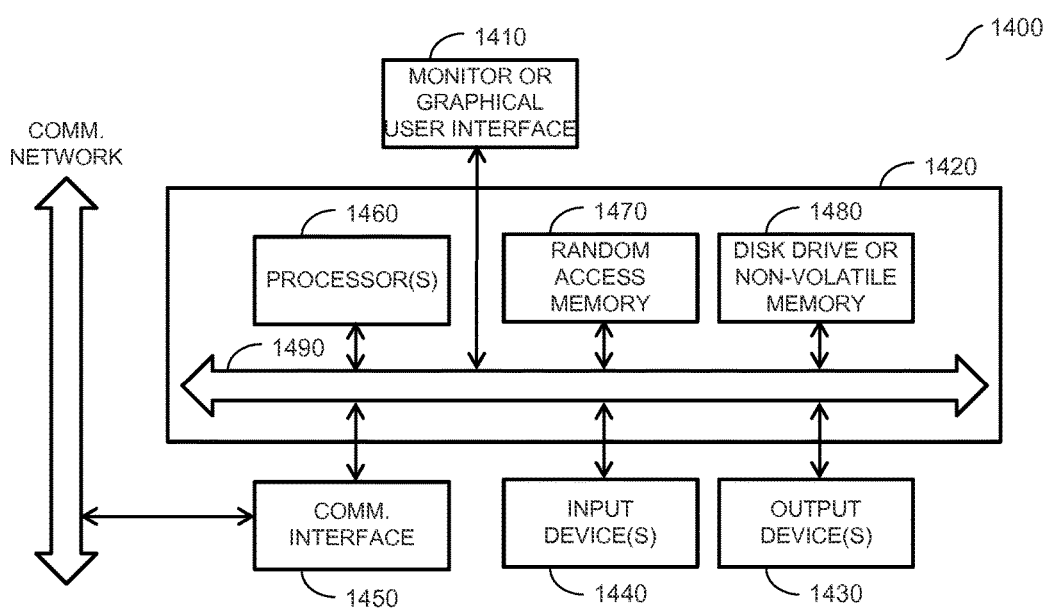
FIG. 14 is a block diagram of a computer system that may incorporate embodiments of the present invention.

FIG. 14 is a block diagram of a computer system that may incorporate embodiments of the present invention. FIG. 14 is merely illustrative of an embodiment incorporating the present invention and does not limit the scope of the invention as recited in the claims. One of ordinary skill in the art would recognize other variations, modifications, and alternatives.

In one embodiment, computer system 1400 typically includes a monitor 1410, a computer 1420, user output devices 1430, user input devices 1440, communications interface 1450, and the like.

As shown in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as random access memory (RAM) 1470 and disk drive 1480.

User input devices 1430 include all possible types of devices and mechanisms for inputting information to computer system 1420. These may include a keyboard, a keypad, a touch screen incorporated into the display, audio input devices such as voice recognition systems, microphones, and other types of input devices. In various embodiments, user input devices 1430 are typically embodied as a computer mouse, a trackball, a track pad, a joystick, wireless remote, drawing tablet, voice command system, eye tracking system, and the like. User input devices 1430 typically allow a user to select objects, icons, text and the like that appear on the monitor 1410 via a command such as a click of a button or the like.

User output devices 1440 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, ISDN), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420, and may be a software program, such as soft DSL, or the like.

In various embodiments, computer system 1400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1420 includes one or more Xeon microprocessors from Intel as processor(s) 1460. Further, one embodiment, computer 1420 includes a UNIX-based operating system.

RAM 1470 and disk drive 1480 are examples of tangible media configured to store data such as embodiments of the present invention, including executable computer code, human readable code, or the like. Other types of tangible media include floppy disks, removable hard disks, optical storage media such as CD-ROMs, DVDs and bar codes, semiconductor memories such as flash memories, non-transitory read-only-memories (ROMS), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main random access memory (RAM) for storage of instructions and data during program execution and a read only memory (ROM) in which fixed non-transitory instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is shown schematically as a single bus, alternative embodiments of the bus subsystem may utilize multiple busses.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to a triple-patterning technology using three colors for validation by way of an example, it is understood that the invention is not limited by the triple-patterning technology but may also be applicable to higher than triple-patterning technologies such as technologies using more than three colors during validation. Although, the invention has been described with reference to an exemplary process for manufacturing certain integrated circuit transistor components by way of an example, it is understood that the invention is not limited by the type of process nor the type of transistor components so long as the process of components may benefit from the use of a triple-patterning or higher-patterning technology. In addition, the technique and system of the present invention is suitable for use with a wide variety of electronic design automation (EDA) tools and methodologies for designing, testing, and/or manufacturing systems characterized by a combination of conserved, signal flow, and event or digital system of equations. The scope of the invention should, therefore, be determined not with reference to the above description, but instead should be determined with reference to the pending claims along with their full scope or equivalents.

What is claimed is:

1. A computational lithography tool executing on a computer for validating an integrated circuit design and implementing a multiple-patterning semiconductor process comprising:
generating, using the computer, a first graph representative of the integrated circuit design, when the computer is invoked to validate the integrated circuit design, wherein the first graph includes a plurality of vertices;
dividing, using the computer, the first graph to create a plurality of sub-graphs from the first graph;
decomposing, using the computer, each of a first subset of the plurality of sub-graphs into at least three sets using a hybrid evolutionary algorithm;
creating, using the computer, a first coloring for the first subset by assigning one of at least three colors for each one of the plurality of vertices of the first subset using a randomized graph coloring heuristic;
modifying, using the computer, the first coloring using a randomized first local search algorithm so as to decrease a value associated with the number of at least one conflict, when a conflict exists, to make a second coloring solution;
returning, using the computer, the second coloring solution as the decomposed first subset of the plurality of sub-graphs when a condition defined by a first cost function is met; and
merging, using the computer, the at least three sets to generate one of at least three colors for each one of the plurality of vertices to form a colored graph, thereby validating the integrated circuit design and implementing the multiple-patterning semiconductor process.

2. The computational lithography tool of claim 1, wherein the colored graph includes at least three colors.

3. The computational lithography tool of claim 1, wherein generating a plurality of sub-graphs from the first graph is performed using a graph simplification algorithm.

4. The computational lithography tool of claim 3, wherein the graph simplification algorithm is selected from a group consisting of connected component decomposition, bi-connected component decomposition, and hiding of vertices with degrees less than at least three.

5. The computational lithography tool of claim 1, wherein the integrated circuit design includes a plurality of shapes, wherein each one of the plurality of vertices is associated with a different one of the plurality of shapes.

6. The computational lithography tool of claim 1, wherein the integrated circuit design includes a plurality of shapes, wherein the first graph includes a plurality of edges.

7. The computational lithography tool of claim 6, wherein each one of the plurality of edges is associated with a different pair of the plurality of shapes, the pair of the plurality of shapes being associated with a design rule violation.

8. The computational lithography tool of claim 6, wherein a conflict is detected when one of the plurality of edges is between a pair of the plurality of vertices colored with the same color.

9. The computational lithography tool of claim 1, wherein the integrated circuit design includes a plurality of shapes, the computational lithography tool further comprising:
assigning, using the computer, each one of the plurality of shapes to a different one of at least three masks when a conflict is not detected after the decomposition, wherein each one of the at least three masks is associated with a different one of the at least three sets.

10. The computational lithography tool of claim 1 further comprising:
generating, using the computer, a second graph representative of the integrated circuit design after detecting a conflict, the second graph being different from the first graph; and
decomposing, using the computer, the second graph into at least three sets using the hybrid evolutionary algorithm to form a second colored graph including at least three colors.

11. The computational lithography tool of claim 10, wherein the second graph includes a plurality of vertices, the computational lithography tool further comprising:
generating, using the computer, a second plurality of sub-graphs from the second graph;
decomposing, using the computer, each of a second subset of the second plurality of sub-graphs into at least three sets using the hybrid evolutionary algorithm; and
merging, using the computer, the at least three sets to generate one of at least three colors for each one of the plurality of vertices of the second graph, said colored second graph being representative of the integrated circuit design.

12. The computational lithography tool of claim 1 further comprising:
resolving the conflict by reworking the integrated circuit design to form a reworked design after detecting at least one conflict and a stop condition;
generating, using the computer, a second graph representative of the reworked design, the second graph being different from the first graph; and
decomposing, using the computer, the second graph into at least three sets using the hybrid evolutionary algorithm to form a second colored graph including at least three colors.

13. The computational lithography tool of claim 12, wherein the stop condition is selected from a group consisting of a validation runtime, and a value corresponding to the number of the at least one conflict output by decomposing the first graph.

14. The computational lithography tool of claim 12, wherein the integrated circuit design includes a plurality of shapes, wherein reworking the integrated circuit design includes moving at least one of the plurality of shapes.

15. The computational lithography tool of claim 12, wherein the integrated circuit design includes a plurality of shapes, wherein reworking the integrated circuit design includes changing at least one of the plurality of shapes.

16. The computational lithography tool of claim 1, wherein the first cost function includes at least one of a number of conflicting edges, a number of conflicting vertices, or a distribution of colors.

17. The computational lithography tool of claim 1, wherein the randomized graph coloring heuristic includes at least one of a Recursive Largest First algorithm, a degree of saturation (DSATUR) algorithm, a sequential vertex coloring algorithm, or a coloring algorithm with polynomial time complexity.

18. The computational lithography tool of claim 1, wherein the randomized first local search algorithm includes at least one of a Tabu Search algorithm, or a Simulated Annealing algorithm.

19. The computational lithography tool of claim 1, wherein the randomized graph coloring heuristic uses more than three colors to color each of the multitude of vertices for the first subset.

20. The computational lithography tool of claim 19 further comprising randomly assigning a color from a first three colors to a vertices having a color greater than three.

21. The computational lithography tool of claim 1, wherein the decomposing further includes:
creating, using the computer, a first plurality of candidate coloring solutions;
iteratively applying, using the computer, the hybrid evolutionary algorithm on the first plurality of candidate coloring solutions in accordance with the cost function to create a second plurality of candidate coloring solutions until a stopping criteria is met;
selecting, using the computer, a coloring solution from the second plurality of candidate coloring solutions in accordance with a second cost function; and
returning, using the computer, the selected coloring solution as the decomposed first subset of the plurality of sub-graphs.

22. The computational lithography tool of claim 21, wherein the stopping criteria includes at least one of a count of iterations exceeds a predetermined count or until no coloring conflict is detected.

23. The computational lithography tool of claim 21, wherein the hybrid evolutionary algorithm comprises:
selecting, using the computer, a plurality of parents from the first plurality of candidate coloring solutions;
creating, using the computer, at least one offspring from the plurality of parents by merging a plurality of color classes from the plurality of parents;
completing, using the computer, the coloring of at least one offspring; applying, using the computer, a second local search to the at least one offspring in accordance with the second cost function; and
replacing, using the computer, at least one candidate coloring solution from the first plurality of candidate coloring solutions by the at least one offspring using a third cost function.

24. The computational lithography tool of claim 23, wherein the plurality of parents are selected randomly.

25. The computational lithography tool of claim 23, wherein the plurality of parents are selected in accordance with the second cost function.

26. The computational lithography tool of claim 23, wherein each one of the plurality of color classes includes a set of the plurality of vertices assigned to the same color.

27. The computational lithography tool of claim 23, wherein the merging includes using a subset of a selected color class.

28. The computational lithography tool of claim 23, wherein the completing includes putting one of the plurality of vertices without an assigned color into one of the plurality of color classes at random.

29. The computational lithography tool of claim 23, wherein the third cost function includes at least one of replacing the at least one candidate coloring solution having lowest quality, randomly replacing the at least one candidate coloring solution, or replacing the at least one candidate coloring solution having highest similarity to the at least one offspring.

30. A non-transitory computer-readable storage medium comprising instructions which when executed by a computer cause the computer to:
generate a first graph representative of an integrated circuit design, when the computer is invoked to validate the integrated circuit design, wherein the first graph includes a plurality of vertices;
divide the first graph to create a plurality of sub-graphs from the first graph;
decompose each of a first subset of the plurality of sub-graphs into at least three sets using a hybrid evolutionary algorithm;
create a first coloring for the first subset by assigning one of at least three colors for each one of the plurality of vertices of the first subset using a randomized graph coloring heuristic;
modify the first coloring using a randomized first local search algorithm so as to decrease a value associated with the number of at least one conflict, when a conflict exists, to make a second coloring solution;
return the second coloring solution as the decomposed first subset of the plurality of sub-graphs when a condition defined by a first cost function is met; and
merge the at least three sets to generate one of at least three colors for each one of the plurality of vertices to form a colored graph.

31. The non-transitory computer-readable storage medium of claim 30, wherein the integrated circuit design includes a plurality of shapes, the instructions further causing the computer to:
assign each one of the plurality of shapes to a different one of at least three masks when a conflict is not detected after the decomposition, wherein each one of the at least three masks is associated with a different one of the at least three sets.

32. The non-transitory computer-readable storage medium of claim 30 further causing the computer to:
generate a second graph representative of the integrated circuit design after detecting a conflict, the second graph being different from the first graph; and
decompose the second graph into at least three sets using the hybrid evolutionary algorithm to form a second colored graph including at least three colors.

33. The non-transitory computer-readable storage medium of claim 32, wherein the second graph includes a plurality of vertices, the instructions further causing the computer to:
generate a second plurality of sub-graphs from the second graph; decompose each of a second subset of the second plurality of sub-graphs into at least three sets using the hybrid evolutionary algorithm; and
merge the at least three sets to generate one of at least three colors for each one of the plurality of vertices of the second graph, said colored second graph being representative of the integrated circuit design.

34. The non-transitory computer-readable storage medium of claim 30 further causing the computer to:
resolve the conflict by reworking the integrated circuit design to form a reworked design after detecting at least one conflict and a stop condition;
generate a second graph representative of the reworked design, the second graph being different from the first graph; and
decompose the second graph into at least three sets using the hybrid evolutionary algorithm to form a second colored graph including at least three colors.

35. The non-transitory computer-readable storage medium of claim 30, wherein the instructions to decompose further cause the computer to:
create a first plurality of candidate coloring solutions;
iteratively apply the hybrid evolutionary algorithm on the first plurality of candidate coloring solutions in accordance with the cost function to create a second plurality of candidate coloring solutions until a stopping criteria is met;

select a coloring solution from the second plurality of candidate coloring solutions in accordance with a second cost function; and return the selected coloring solution as the decomposed first subset of the plurality of sub-graphs.

36. The non-transitory computer-readable storage medium of claim 35, wherein the instructions to apply the hybrid evolutionary algorithm cause the computer to:

select a plurality of parents from the first plurality of candidate coloring solutions;

create at least one offspring from the plurality of parents by merging a plurality of color classes from the plurality of parents;

complete the coloring of at least one offspring;

apply a second local search to the at least one offspring in accordance with the second cost function; and replace at least one candidate coloring solution from the first plurality of candidate coloring solutions by the at least one offspring using a third cost function.

37. A computational lithography tool system for validating an integrated circuit design and implementing a multiple-patterning semiconductor process, the computational lithography tool system configured to:

generate a first graph representative of the integrated circuit design, when the system is invoked to validate the integrated circuit design, wherein the first graph includes a plurality of vertices;

divide the first graph to create a plurality of sub-graphs from the first graph;

decompose each of a first subset of the plurality of sub-graphs into at least three sets using a hybrid evolutionary algorithm;

create a first coloring for the first subset by assigning one of at least three colors for each one of the plurality of vertices of the first subset using a randomized graph coloring heuristic;

modify the first coloring using a randomized first local search algorithm so as to decrease a value associated with the number of at least one conflict, when a conflict exists, to make a second coloring solution;

return the second coloring solution as the decomposed first subset of the plurality of sub-graphs when a condition defined by a first cost function is met; and merge the at least three sets to generate one of at least three colors for each one of the plurality of vertices to form a colored graph, to thereby validate the integrated circuit design and implement the multiple-patterning semiconductor process.

38. The computational lithography tool system of claim 37, wherein the integrated circuit design includes a plurality of shapes, the computational lithography tool system further configured to:

assign each one of the plurality of shapes to a different one of at least three masks when a conflict is not detected after the decomposition, wherein each one of the at least three masks is associated with a different one of the at least three sets.

39. The computational lithography tool system of claim 37 further configured to:

generate a second graph representative of the integrated circuit design after detecting a conflict, the second graph being different from the first graph; and decompose the second graph into at least three sets using the hybrid evolutionary algorithm to form a second colored graph including at least three colors.

40. The computational lithography tool system of claim 39, wherein the second graph includes a plurality of vertices, the computational lithography tool system further configured to:

generate a second plurality of sub-graphs from the second graph;

decompose each of a second subset of the second plurality of sub-graphs into at least three sets using the hybrid evolutionary algorithm; and merge the at least three sets to generate one of at least three colors for each one of the plurality of vertices of the second graph, said colored second graph being representative of the integrated circuit design.

41. The computational lithography tool system of claim 37 further configured to:

resolve the conflict by reworking the integrated circuit design to form a reworked design after detecting at least one conflict and a stop condition;

generate a second graph representative of the reworked design, the second graph being different from the first graph; and decompose the second graph into at least three sets using the hybrid evolutionary algorithm to form a second colored graph including at least three colors.

42. The computational lithography tool system of claim 37, wherein to decompose further configures the computational lithography tool system to:

create a first plurality of candidate coloring solutions;

iteratively apply the hybrid evolutionary algorithm on the first plurality of candidate coloring solutions in accordance with the cost function to create a second plurality of candidate coloring solutions until a stopping criteria is met;

select a coloring solution from the second plurality of candidate coloring solutions in accordance with a second cost function; and return the selected coloring solution as the decomposed first subset of the plurality of sub-graphs.

43. The computational lithography tool system of claim 42, wherein stopping criteria includes at least one of a count of iterations, wherein to apply the hybrid evolutionary algorithm configures the computational lithography tool system to:

select a plurality of parents from the first plurality of candidate coloring solutions;

create at least one offspring from the plurality of parents by merging a plurality of color classes from the plurality of parents;

complete the coloring of at least one offspring;

apply a second local search to the at least one offspring in accordance with the second cost function; and replace at least one candidate coloring solution from the first plurality of candidate coloring solutions by the at least one offspring using a third cost function.

* * * * *